(12) United States Patent
Endo et al.

(10) Patent No.: US 8,169,824 B2
(45) Date of Patent: May 1, 2012

(54) SEMICONDUCTOR DEVICE INCLUDING CONTACT PLUG HAVING AN ELLIPTICAL SECTIONAL SHAPE

(75) Inventors: Masato Endo, Ashigarakami-gun (JP); Itaru Kawabata, Yokohama (JP); Shinichi Watanabe, Yokohama (JP); Hiroyuki Nitta, Yokohama (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 12/699,319

(22) Filed: Feb. 3, 2010

(65) Prior Publication Data

US 2010/0202208 A1   Aug. 12, 2010

(30) Foreign Application Priority Data

Feb. 6, 2009   (JP) ................................ 2009-026263

(51) Int. Cl.
 *G11C 11/34* (2006.01)
(52) U.S. Cl. .................. 365/185.05; 365/51; 365/63
(58) Field of Classification Search ............. 365/185.05, 365/51, 63
See application file for complete search history.

(56) References Cited

U.S. PATENT DOCUMENTS

| 6,072,242 A * | 6/2000 | Son ................................ 257/774 |
| 6,300,683 B1 | 10/2001 | Nagasaka et al. |
| 6,727,026 B2 | 4/2004 | Kuji et al. |
| 6,784,479 B2 * | 8/2004 | Park ................................ 257/308 |
| 7,368,802 B2 * | 5/2008 | Hayakawa ..................... 257/529 |
| 2005/0253183 A1 | 11/2005 | Umezawa et al. |
| 2006/0263958 A1 | 11/2006 | Kajimoto et al. |

FOREIGN PATENT DOCUMENTS

| JP | 7-302905 | 11/1995 |
| JP | 2005-311131 | 11/2005 |
| JP | 2008-147447 | 6/2008 |

* cited by examiner

*Primary Examiner* — Son Dinh
(74) *Attorney, Agent, or Firm* — Oblon, Spivak, McClelland, Maier & Neustadt, L.L.P.

(57) ABSTRACT

A semiconductor device includes a first MOS transistor, second MOS transistors, first contact plugs, and a second contact plug. The first MOS transistor with a first conductivity is formed on a semiconductor substrate. The second MOS transistors with a second conductivity are formed on the semiconductor substrate. The first contact plugs has a circular planar shape. The second contact plug has an elliptical planar shape and is formed on a source or a drain in one of the second MOS transistors. The first contact plugs are formed on sources or drains in the remaining second MOS transistors and the first MOS transistor.

19 Claims, 13 Drawing Sheets

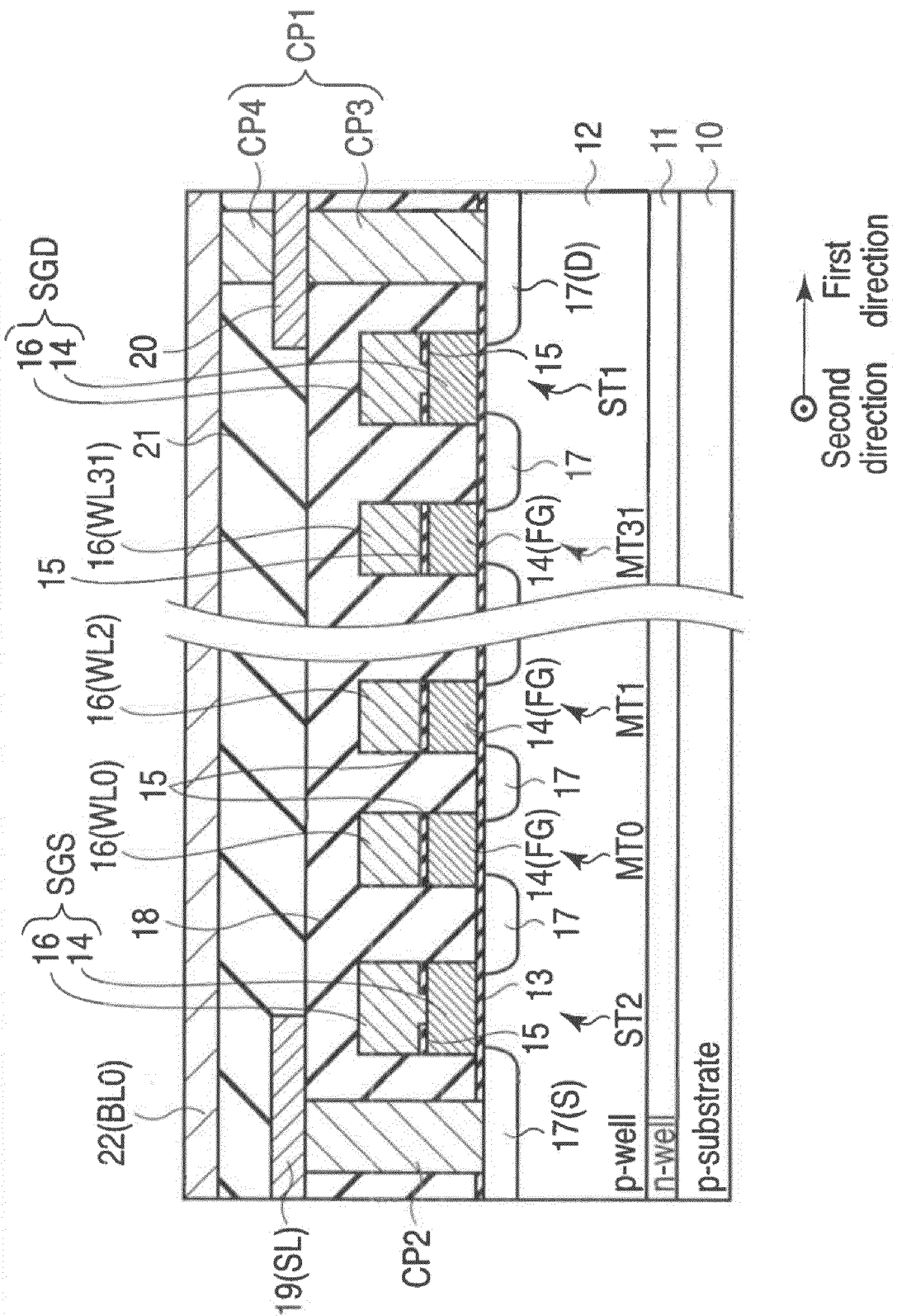
F I G. 3

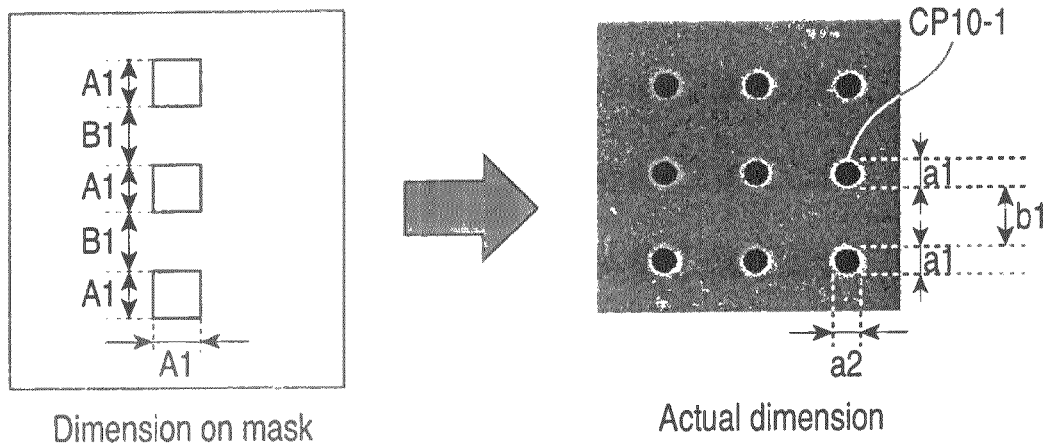
FIG. 9
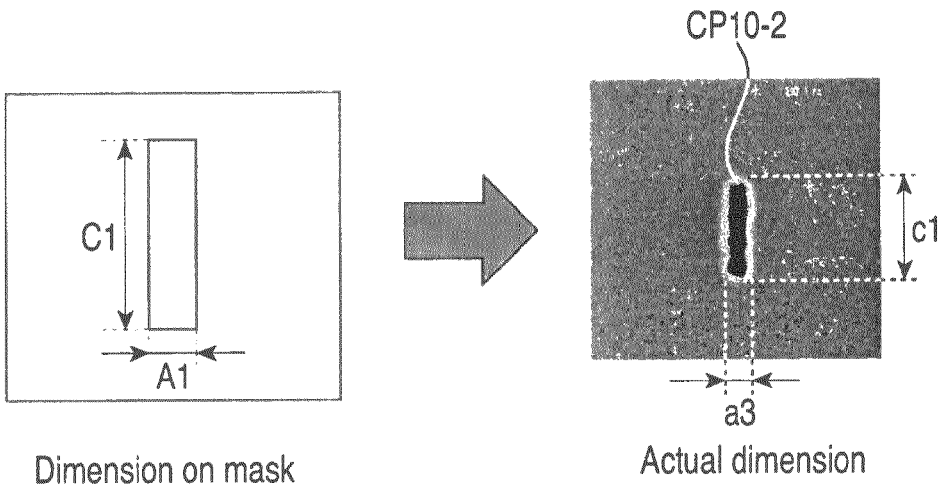
FIG. 10
| | n-channel MOS transistor | p-channel MOS transistor |
|---|---|---|
| Required specification of contact resistance | 1~2 [kΩ] | 3~5 [kΩ] |
| Resistance of circular-hole contact plug (first contact plug CP10-1) | 300~1000 [Ω] | 10~100 [kΩ] |
| Resistance of elliptical-hole contact plug (second contact plug CP10-2) | — | 1~3 [kΩ] |
FIG. 11A

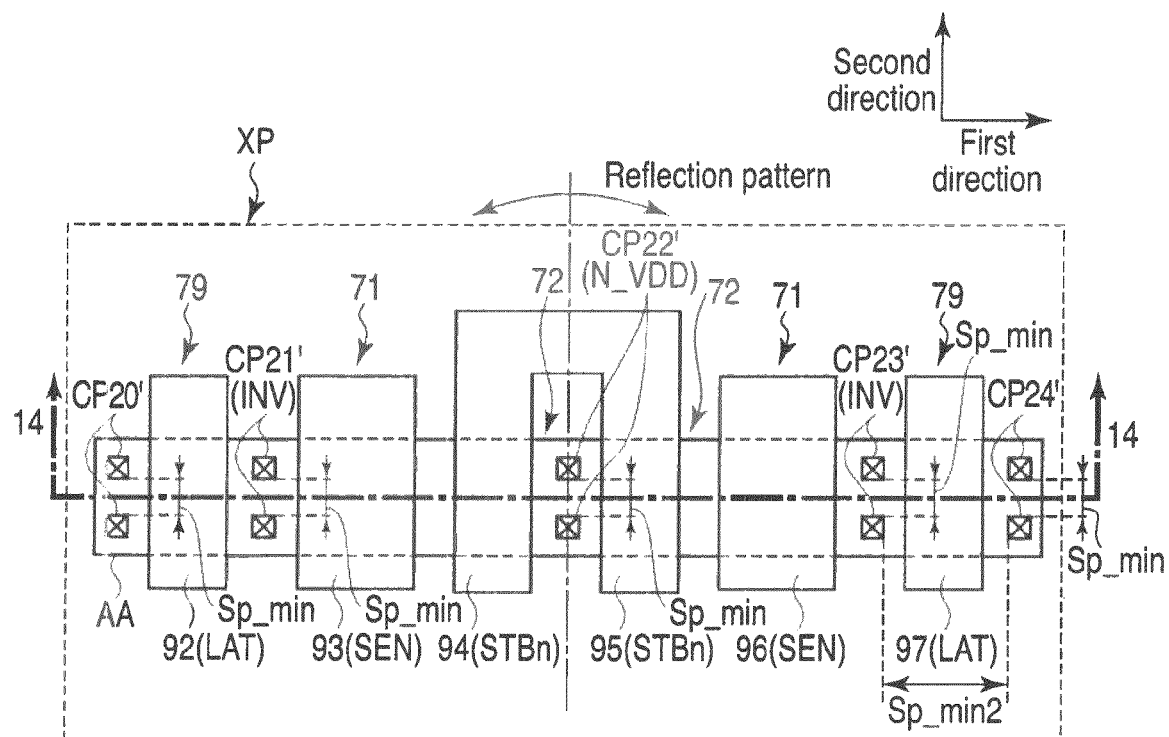
F I G. 15
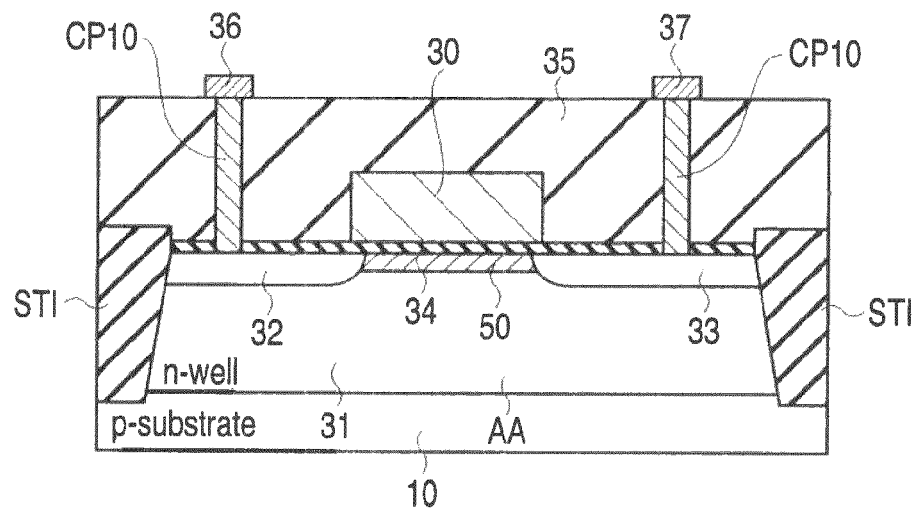
F I G. 16

Second direction  First direction

SEMICONDUCTOR DEVICE INCLUDING CONTACT PLUG HAVING AN ELLIPTICAL SECTIONAL SHAPE

CROSS-REFERENCE TO RELATED APPLICATIONS

This application is based upon and claims the benefit of priority from prior Japanese Patent Application No. 2009-026263, filed Feb. 6, 2009, the entire contents of which are incorporated herein by reference.

BACKGROUND OF THE INVENTION

1. Field of the Invention

The present invention relates to a semiconductor device comprising a contact plug having an elliptical sectional shape. For example, the invention relates to a semiconductor storage device such as a NAND flash memory.

2. Description of the Related Art

Conventionally, an electrically erasable and programmable read-only memory (EEPROM) is well known as a nonvolatile semiconductor memory, and the NAND flash memory is widely used as an EEPROM in which high integration can be achieved.

The NAND flash memory includes various circuits (hereinafter collectively referred to as a peripheral circuit) in order to program, read, and erase memory cell data. Recently, dimensions of a MOS transistor included in the peripheral circuit are shrunk with finer design rules of the memory cell. For example, Jpn. Pat. Appln. KOKAI Publication No. 2005-311131 discloses the shrinking of the dimensions of the MOS transistor. As a result, for example, an amount of current passed through the MOS transistor is reduced.

BRIEF SUMMARY OF THE INVENTION

A semiconductor device according to an aspect of the present invention includes:

a first MOS transistor with a first conductivity formed on a semiconductor substrate;

a plurality of second MOS transistors with a second conductivity formed on the semiconductor substrate;

a plurality of first contact plugs with a circular planar shape; and a second contact plug with an elliptical planar shape formed on a source or a drain in one of the second MOS transistors, the first contact plugs being formed on sources or drains in the remaining second MOS transistors and the first MOS transistor.

BRIEF DESCRIPTION OF THE SEVERAL VIEWS OF THE DRAWING

FIG. 3 is a cross-sectional view taken along line 3-3 of FIG. 2;

FIG. 9 is a schematic diagram illustrating a mask for forming a first contact plug and a cross-sectional photograph illustrating an actually-formed contact hole of the first embodiment;

FIG. 10 is a schematic diagram illustrating a mask for forming a second contact plug and a cross-sectional photograph illustrating an actually-formed contact hole of the first embodiment;

FIG. 11A is a table illustrating necessary specifications and actual values of contact resistances of a MOS transistor;

FIG. 15 is a plan view of the sense amplifier;

FIGS. 16 to 18 are sectional views illustrating peripheral transistors according to modifications of the first and second embodiments;

DETAILED DESCRIPTION OF THE INVENTION

First Embodiment

A semiconductor device according to a first embodiment of the present invention will be described taking a NAND flash memory by way of example. In drawings shown below, since an understanding is easy, a scales may differ.

(Configuration of NAND Flash Memory)

Figure 1:
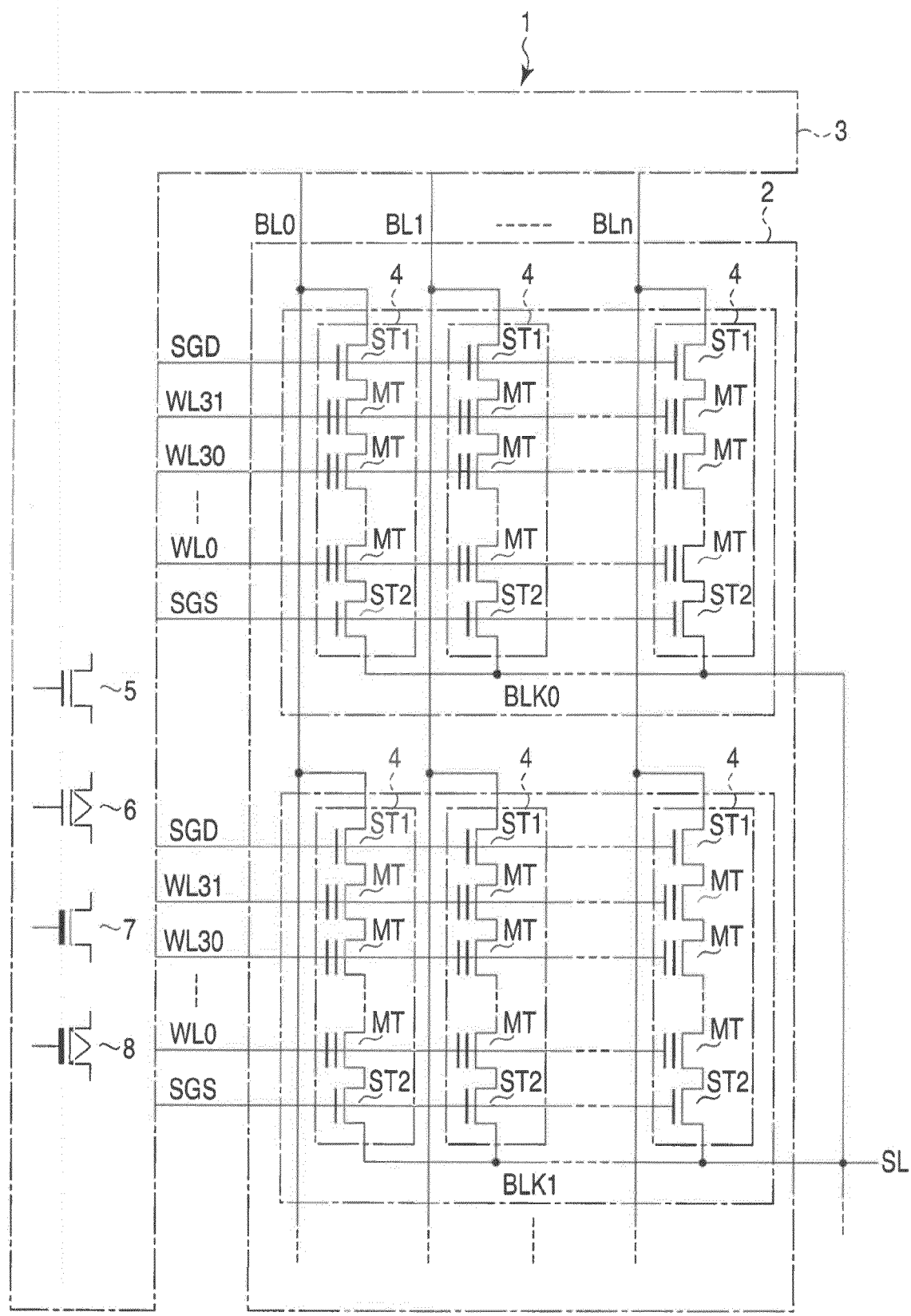
FIG. 1 is a block diagram illustrating a flash memory according to a first embodiment of the invention.

An entire configuration of the NAND flash memory will be described with reference to FIG. 1. FIG. 1 is a block diagram partially illustrating a configuration of a NAND flash memory according to the first embodiment of the invention. Referring to FIG. 1, a NAND flash memory 1 includes a memory cell array 2 and a peripheral circuit 3.

First the memory cell array 2 will be described. The memory cell array 2 includes plural memory blocks BLK0 to BLKm (m is a natural number greater than unity). Hereinafter the memory blocks BLK0 to BLKm are simply referred to as memory block BLK unless distinguished from one another. Each of the memory blocks BLK includes n (n is a natural number greater than zero) memory cell units 4.

For example, each of the memory cell units 4 includes 32 memory cell transistors MT and select transistors ST1 and ST2. The memory cell transistor MT has a stacked gate structure, which includes a charge accumulation layer (for example, floating gate) that is formed on a semiconductor substrate with a gate insulating film interposed therebetween and a control gate that is formed on the charge accumulation layer with an inter-gate insulating film interposed therebetween. The number of memory cell transistors MT is not limited to 32, but, for example, 8, 16, 64, 128, or 256 memory cell transistors MT may be provided. Source and drain are shared by adjacent memory cell transistors MT. Current paths of the memory cell transistors MT are disposed between select transistors ST1 and ST2 so as to be connected in series. The drain on one end side of the series-connected memory cell transistors MT is connected to the source of select transistor ST1, and the source on the other end side of the series-connected memory cell transistors MT is connected to the drain of select transistor ST2.

In each memory block BLK, control gates of the memory cell transistors MT located on the same row are commonly connected to one of word lines WL0 to WL31, and gates of select transistors ST1 and ST2 of the memory cell units 4 located on the same row are commonly connected to select gate lines SGD and SGS, respectively. For the sake of convenience, hereinafter the word lines WL0 to WL31 are occasionally referred to as word line WL. The sources of select transistors ST2 are commonly connected to a source line SL. It is not always necessary to provide select transistors ST1 and ST2, but one of select transistors ST1 and ST2 may be provided as long as the memory cell unit 4 can be selected.

In the memory cell array 2, the drains of select transistors ST1 in the memory cell units 4 located on the same column are commonly connected to the same bit lines BL0 to BLn (n is a natural number). The bit lines BL0 to BLn are occasionally referred to as bit line BL. That is, the bit line BL commonly connects the memory cell units 4 among the plural memory blocks BLK. On the other hand, the word line WL and select gate lines SGD and SGS commonly connect the memory cell units 4 in the same memory block BLK. The memory cell units 4 in the memory cell array 2 are commonly connected to the same source line SL.

Data is collectively stored to the plural memory cell transistors MT connected to the same word line WL, and the write unit is referred to as a page. Data in the memory cell units 4 in the same memory block BLK is collectively erased. That is, the memory block BLK becomes a unit of erasing.

A configuration of the peripheral circuit 3 will be described. The peripheral circuit 3 controls the operations for programming, reading, and erasing data with respect to the memory cell transistor MT. Although not illustrated, the peripheral circuit 3 includes a row decoder, a sense amplifier, a voltage generating circuit, and a control circuit.

In reading the data, the sense amplifier senses and amplifies the data read from the memory cell transistor MT onto the bit line BL. At this point, the sense amplifier senses a current passed through the bit line BL and collectively determines the data for all the bit lines BL. In programming the data, the sense amplifier transfers storage data to the bit line BL.

The row decoder is provided in each memory block BLK. During the program operation, read operation, and erase operation, the row decoder applies a voltage to the select gate lines SGD and SGS and the word line WL, which are connected to corresponding memory blocks BLK, based on an externally-input row address RA.

For example, in programming the data, the row decoder makes the select gate line SGD high to turn on the select transistor ST1, and makes the select gate line SGS low to turn off the select transistor ST2. The row decoder applies a voltage VPGM to the selected word line WL. The memory cell transistors MT which should be programmed the data are connected to the selected word line WL. The voltage VPGM is a positive high voltage that is used to inject electrons in a charge accumulation layer by FN tunneling. On the other hand, a voltage VPASS is applied to the non-selected word lines. The voltage VPASS is a voltage that can turn on the memory cell transistor MT irrespective of the storage data, and is less than the voltage VPGM. Therefore, the programming data put on the bit lines by the sense amplifier is transferred to the selected memory cell transistors MT.

In reading the data, select transistors ST1 and ST2 are turned on by making the select gate lines SGD and SGS high. A voltage VCGR is applied to the selected word line WL, and the memory cell transistors MT from which the data should be read are connected to the selected word line WL. The voltage VCGR is a voltage corresponding to a read target (read level). On the other hand, a voltage VREAD is applied to the non-selected word lines. The voltage VREAD is a voltage that can turn on the memory cell transistors MT irrespective of the storage data. Therefore, the current is passed from the bit line BL to the source line SL when the selected memory cell transistor MT is turned on, and the current is not passed when the selected memory cell transistor MT is turned off.

The control circuit receives a command and an address from the outside. The control circuit controls the operation of the circuit block based on the received command and address. That is, the control circuit includes a sequencer to control a set of sequences during the program operation, read operation, and erase operation. The control circuit issues a command to the voltage generating circuit to generate various necessary voltages.

The voltage generating circuit includes plural charge pump circuits, and generates voltages necessary for the program operation, read operation, and erase operation in response to the command of the control circuit.

The peripheral circuit includes plural MOS transistors. The MOS transistors include a low-voltage n-channel MOS transistor 5, a low-voltage p-channel MOS transistor 6, and a high-voltage n-channel MOS transistor 7, and a high-voltage p-channel MOS transistor 8. MOS transistors 7 and 8 have a withstand voltage greater than that of MOS transistors 5 and 6. Sometimes MOS transistors 5 to 8 are collectively referred to as peripheral transistor unless distinguished from one another.

(Planar and Cross-Sectional Configurations of Memory Cell Array 2)

Figure 2:
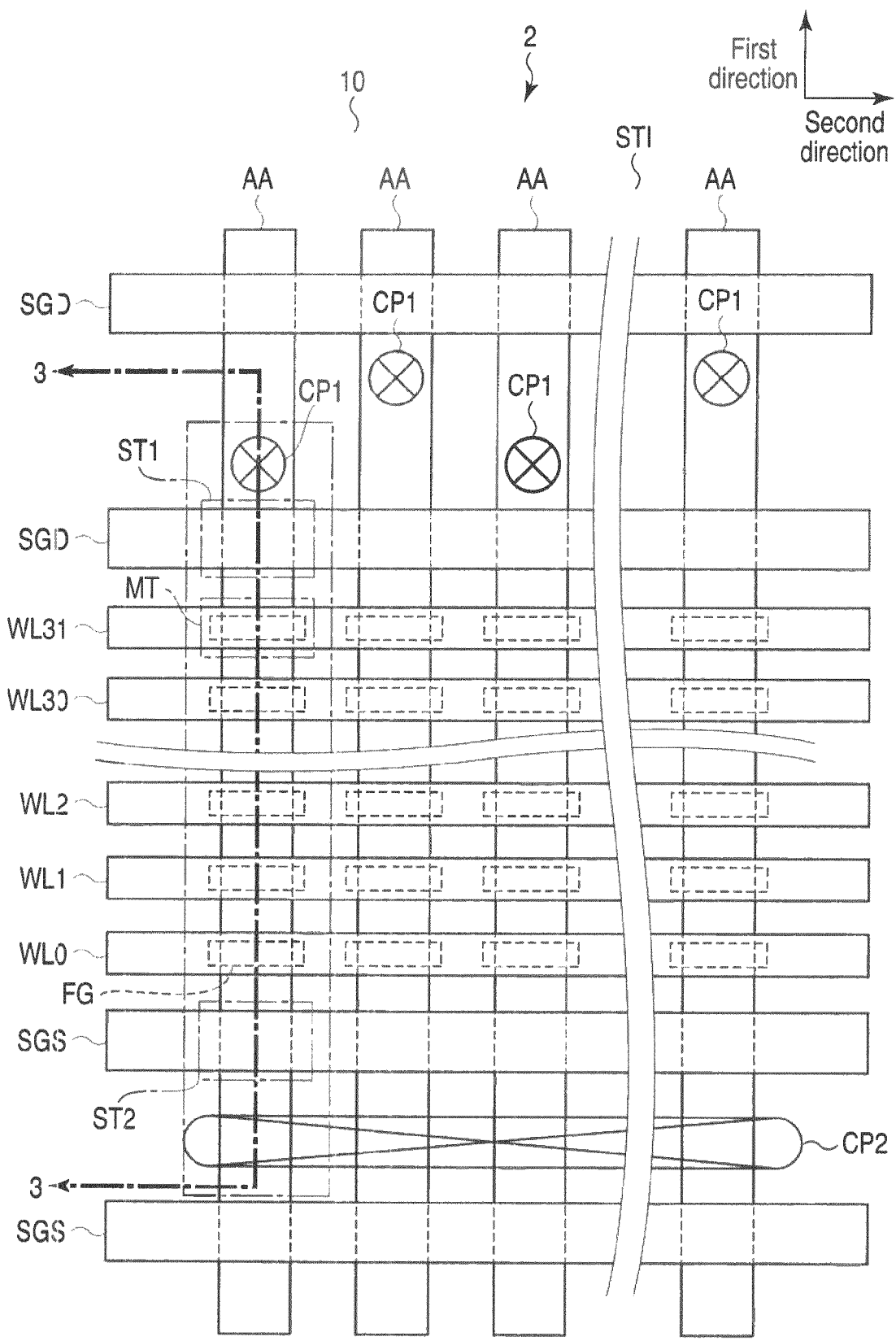
FIG. 2 is a plan view illustrating a memory cell array of the first embodiment.

Planar and cross-sectional configurations of the memory cell array 2 will be described below. FIG. 2 is a plan view illustrating the memory cell array 2.

As illustrated in FIG. 2, in a p-type semiconductor substrate (silicon substrate) 10, plural stripe-like element regions AA are provided in parallel along a first direction. An isolation region STI is formed between adjacent element regions AA, and the element regions AA are electrically separated from each other by the isolation region STI.

On the semiconductor substrate 10, the stripe-like word lines WL and select gate lines SGD and SGS are formed in a second direction orthogonal to the first direction so as to cross the element regions AA. A charge accumulation layer (floating gate FG) is provided in a region where the word line WL and the element region AA intersect each other. The width in the first direction of the charge accumulation layer is equal to the width of the first direction of the word line WL, and the width in the second direction of the charge accumulation layer is equal to the width in the second direction of the element region AA. The memory cell transistor MT is provided in a region where the word line WL and the element region AA intersect each other. Select transistors ST1 and ST2 are respectively provided in regions where the select gate lines SGD and SGS and the element region AA intersect each other. Impurity diffusion layers are formed in the element regions AA between the word lines WL, between the select gate lines, and between the word line and the select gate line. The impurity diffusion layer formed one of the source region and drain region of the memory cell transistor MT and select transistors ST1 and ST2.

The plural memory blocks BLK are disposed along the first direction of FIG. 2. In two memory blocks BLK adjacent to each other, the select transistor ST1 in one memory block BLK is adjacent to the select transistor ST1 in another memory block BLK, and these select transistors ST1 share the impurity diffusion layer (i.e. drain region). Alternatively, the select transistor ST2 in one memory block BLK is adjacent to the select transistor ST2 in another memory block BLK, and these select transistors ST2 share the impurity diffusion layer (i.e. source region).

Accordingly, the impurity diffusion layer formed in the element region AA between the adjacent select gate lines SGD acts as the drain region of the selection transistor ST1. A contact plug CP1 is formed on the drain region. One contact plug CP1 is provided in each drain region. The contact plug CP1 is connected to a stripe-like bit line BL (not illustrated) formed in the first direction. The impurity diffusion layer formed in the element region AA between the adjacent select gate lines SGS acts as the source region of select transistor ST2. A contact plug CP2 is formed on the source region. Contact plug CP2 is connected to a source line SL (not illustrated).

Contact plug CP1 is provided in each drain shared by adjacent select transistors ST1, and contact plugs CP1 are alternately located in the second direction. That is, one of contact plugs CP1 is disposed close to one of the select gate lines SGD (away from the other select gate line SGD), and another contact plug CP1 adjacent to contact plug CP1 in the second direction is disposed close to the other select gate line SGD (away from one of the select gate lines SGD). Contact plug CP1 has a substantially circular planar shape.

On the other hand, contact plug CP2 is formed so as to cross the plural select transistors ST2. That is, one contact plug CP2 is formed so as to come into contact with the sources of the plural select transistors ST2, and have an elliptical planar shape with the major axis in the second direction.

The sectional configuration of the memory cell array 2 will be described below with reference to FIG. 3. FIG. 3 is a cross-sectional view taken along line 3-3 (first direction) of FIG. 2.

As illustrated in FIG. 3, an n-type well region 11 is formed in a surface region of the p-type semiconductor substrate 10, and a p-type well region 12 is formed in a surface region of the n-type well region 11. A gate insulating film 13 is formed on the p-type well region 12, and gate electrodes of the memory cell transistor MT and select transistors ST1 and ST2 are formed on the gate insulating film 13. The gate electrode of each of the memory cell transistor MT and select transistors ST1 and ST2 includes a polysilicon layer 14 formed on the gate insulating film 13, an inter-gate insulating film 15 formed on the polysilicon layer 14, and a polysilicon layer 16 formed on the inter-gate insulating film 15. For example, the inter-gate insulating film 15 is formed by a silicon oxide film, or formed by an ON film, an NO film, or an ONO film, which is a stacked structure of the silicon oxide film and a silicon nitride film, a stacked structure thereof, or a stacked structure of $TiO_2$, $HfO_2$, $Al_2O_3$, $HfAlO_x$, or HfAlSi film and the silicon oxide film or silicon nitride film. The gate insulating film 13 acts as a tunneling film.

In the memory cell transistor MT, the polysilicon layer 14 acts as a floating gate (FG). The polysilicon layer 16 is commonly connected to the memory cell transistors MT adjacent to a direction orthogonal to the bit line, and the polysilicon layer 16 acts as a control gate (word line WL).

In select transistors ST1 and ST2, the inter-gate insulating film 15 is partially removed, whereby the polysilicon layers 14 and 16 adjacent to each other in the word line direction are commonly connected. The polysilicon layers 14 and 16 act as the select gate lines SGS and SGD. Alternatively, only the polysilicon layer 14 acts as the select gate line. At this point, potentials at the polysilicon layers 16 of select transistors ST1 and ST2 are set to a constant potential or a floating state.

An $n^+$-type impurity diffusion layer 17 is formed on a surface of the semiconductor substrate 10 located between the gate electrodes. The impurity diffusion layer 17 is shared by the transistors adjacent to each other, and acts as the source (S) or the drain (D). The region between the adjacent source and drain acts as a channel region in which an electron moves. Each of the MOS transistors functioning as the memory cell transistor MT and select transistors ST1 and ST2 includes the gate electrode, the impurity diffusion layer 17, and the channel region.

An interlayer insulating film 18 is formed on the semiconductor substrate 10 such that the memory cell transistor MT and select transistors ST1 and ST2 are covered therewith. Contact plug CP2 is formed in the interlayer insulator 18 so as to reach the impurity diffusion layer (source) 17 of the source-side select transistor ST2. A metal interconnection layer 19 connected to contact plug CP2 is formed on the interlayer insulating film 18. The metal interconnection layer 19 acts as the source line SL. A contact plug CP3 is also formed in the interlayer insulating film 18 so as to reach the impurity diffusion layer (drain) 17 of the drain-side select transistor ST1. A metal interconnection layer 20 connected to contact plug CP3 is formed on the interlayer insulating film 18.

An interlayer insulating film 21 is formed on the interlayer insulating film 18 such that the metal interconnection layers 19 and 20 are covered therewith. A contact plug CP4 is formed in the interlayer insulating film 21 so as to reach the metal interconnection layer 20. A metal interconnection layer 22 commonly connected to the plural contact plugs CP4 are formed on the interlayer insulating film 21. The metal interconnection layer 22 acts as the bit line BL. That is, contact plugs CP3 and CP4 and the metal interconnection layer 20 correspond to contact plug CP1 of FIG. 2.

The plural memory cell units 4 included in the memory cell array 2 are formed in the same well region 12.

(Planar and Cross-Sectional Configurations of Peripheral Transistor)

Configurations of peripheral transistors 5 to 8 will be described below.

Figure 4:
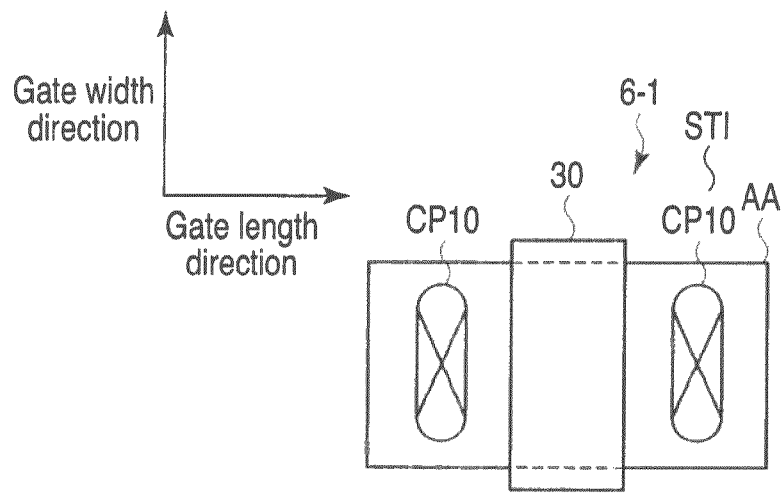
FIGS. 4 and 5 are plan views illustrating peripheral transistors of the first embodiment.
Figure 5:
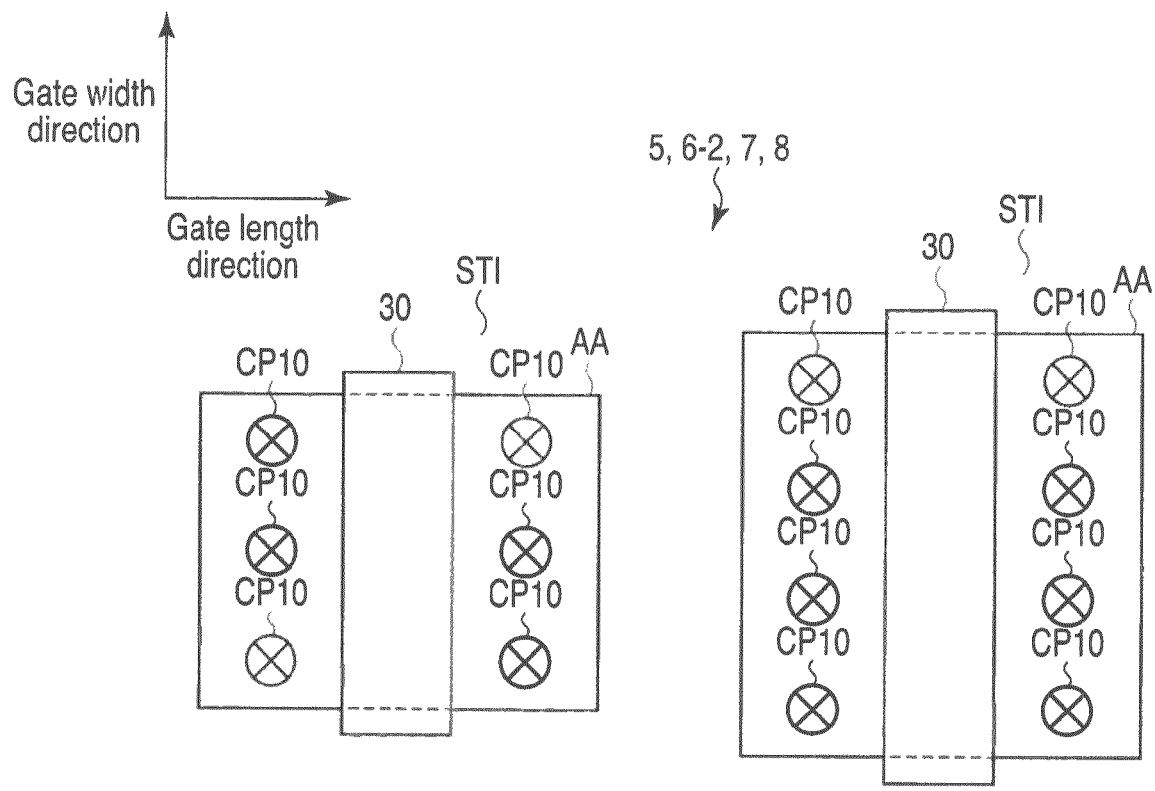

Planar configurations of peripheral transistors 5 to 8 will be described with reference to FIGS. 4 and 5. FIG. 4 is a plan view illustrating one (hereinafter referred to as peripheral transistor 6-1) of plural peripheral transistors 6 included in the peripheral circuit 3. That is, FIG. 4 is a plan view illustrating a MOS transistor in which only one contact plug having an elliptical sectional shape is formed on each of the source and drain. FIG. 5 is a plan view illustrating remaining peripheral transistor 6 (hereinafter referred to as peripheral transistor 6-2) except for peripheral transistor 6-1 and peripheral transistors 5, 7, and 8. That is, FIG. 5 is a plan view illustrating a MOS transistor in which at least three contact plugs having circular sectional shape are formed on each of the source and drain.

As illustrated in FIGS. 4 and 5, peripheral transistors 5 to 8 are formed in the element region AA surrounded by the isolation region STI. Each of peripheral transistors 5 to 8 includes a gate electrode 30, a source, and a drain. The gate electrode 30 is formed so as to cross the element region AA. Contact plugs CP10 are formed on the source and the drain.

Contact plug CP10 formed on peripheral transistor 6-1 has the elliptical planar shape whose major axis extends in the gate width direction, and is provided in each source and each drain (FIG. 4). Contact plugs CP10 formed on peripheral transistors 5, 6-2, 7, and 8 have the circular planar shape, and the plural contact plugs CP10, for example, at least three contact plugs CP10 are provided in each source and each drain (FIG. 5). In FIG. 5, three or four contact plugs CP10 are provided only by way of example. However, at least five contact plugs CP10 may be provided.

Figure 6:
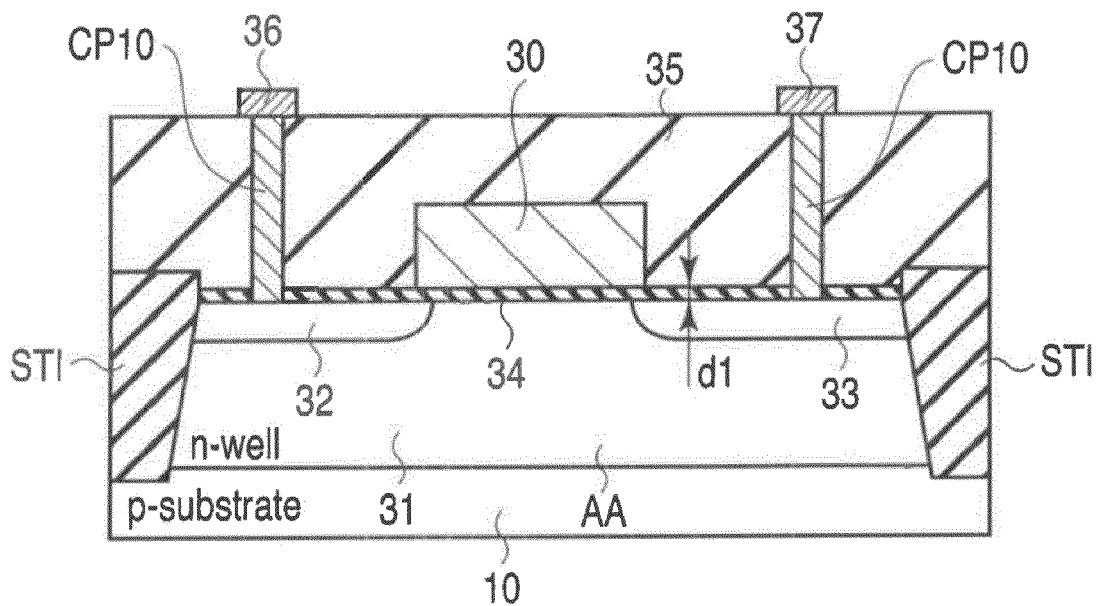
FIGS. 6 and 7 are cross-sectional views illustrating the peripheral transistors of the first embodiment.

Sectional configurations of peripheral transistors 5 to 8 will be described below. The low-voltage peripheral transistors 5 and 6 will be described with reference to FIG. 6. FIG. 6 is a sectional view illustrating peripheral transistor 6 along a gate length direction.

As illustrated in FIG. 6, an n-type well region 31 is formed in the surface region of the element region AA of the semiconductor substrate 10. $P^+$-type impurity diffusion layers 32 and 33 are formed in the surface region of the n-type well region 31 while separated from each other. The impurity diffusion layers 32 and 33 act as the source and drain of peripheral transistor 6. The gate electrode 30 is formed on the n-type well region 31 between the impurity diffusion layers 32 and 33 while a gate insulating film 34 is interposed between the gate electrode 30 and the n-type well region 31. The gate insulating film 34 has a film thickness of d1.

An interlayer insulating film 35 is formed on the semiconductor substrate 10 such that peripheral transistor 6 is covered therewith. Contact plugs CP10 are formed in the interlayer insulating film 35 so as to reach the impurity diffusion layers 32 and 33, and metal interconnection layers 36 and 37 are formed on the interlayer insulating film 35 while respectively connected to contact plugs CP10.

The sectional configuration of peripheral transistor 5 is similar to that of FIG. 6 except for a conductive type. For peripheral transistor 5, the n-type well region 31 is eliminated, and peripheral transistor 5 is formed on the semiconductor substrate 10. The impurity diffusion layers 32 and 33 are made of an $n^+$-type conductive type material.

Figure 7:
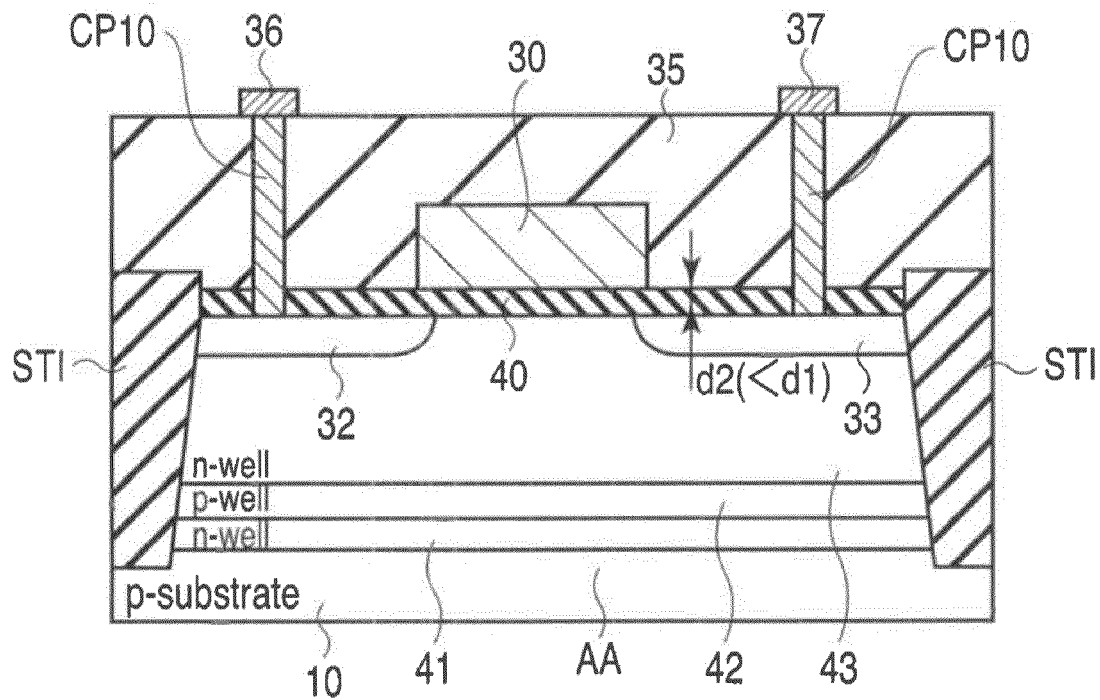

The high-voltage peripheral transistors 7 and 8 will be described with reference to FIG. 7. FIG. 7 is a sectional view illustrating peripheral transistor 8 along the gate length direction.

As illustrated in FIG. 7, an n-type well region 41 is formed in the surface region of the element region AA of the semiconductor substrate 10, a p-type well region 42 is formed in the surface region of the n-type well region 41, and an n-type well region 43 is formed in the surface region of the p-type well region 42. An upper surface of the n-well 41 and a bottom surface of the p-well 42 are higher than the bottom surface of the isolation region STI. Peripheral transistor 8 is formed on the n-type well region 43. Other configurations are similar to those of FIG. 6. However, a film thickness d2 of the gate insulating film 40 in peripheral transistor 8 is greater than the film thickness d1 of peripheral transistors 5 and 6.

A well configuration in FIG. 7 (the n-type well region 41, the p-type well region 42 and n-type well region 43) may be same configuration in FIG. 6 (the n-well 31). An upper surface of the n-well region 41 and a bottom surface of the p-well region 42 may be lower than the bottom surface of the isolation region STI.

The sectional configuration of peripheral transistor 7 is similar to that of FIG. 7 except for the conductive type. For peripheral transistor 7, the n-type well region 43 is eliminated, and peripheral transistor 7 is formed on the p-type well region 42. The impurity diffusion layers 32 and 33 are made of the $n^+$-type conductive type material.

The well regions 42 and 43 are eliminated when control is not performed so as to make a difference in back-gate bias between MOS transistors 5 and 6 and MOS transistors 7 and 8. That is, MOS transistors 7 and 8 may be formed on the semiconductor substrate 10 and the well region 41, respectively. In order to enhance the source-drain withstand voltage, MOS transistor 7 may be formed on the semiconductor substrate 10 while the well region is not formed.

(Element Size of Peripheral Transistor)

Figure 8:
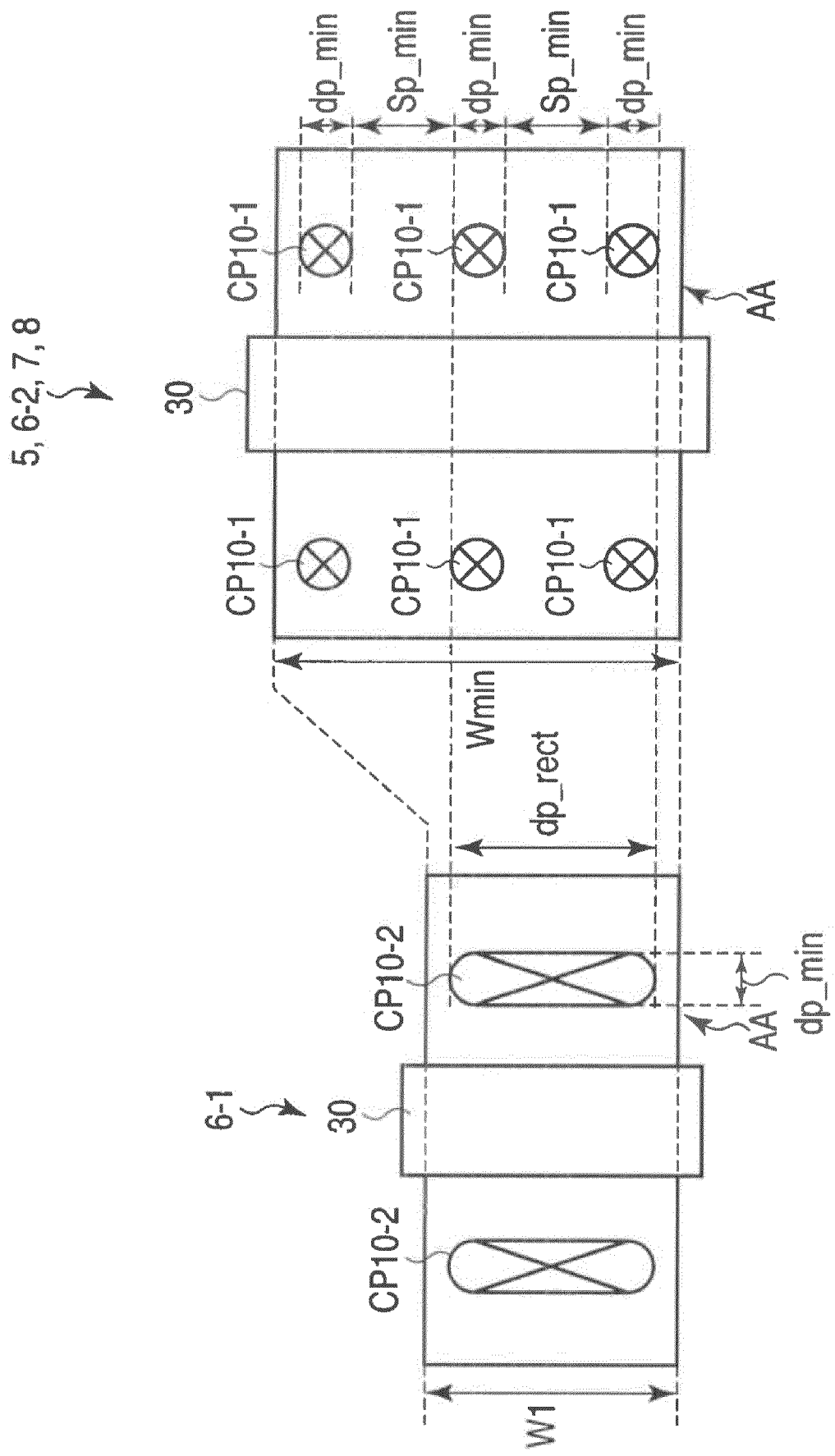
FIG. 8 is a plan view illustrating the peripheral transistor of the first embodiment.

Sizes of peripheral transistors 5 to 8 will be described with reference to FIG. 8. FIG. 8 is a plan view illustrating peripheral transistor 6-1 and one of peripheral transistors 5, 6-2, 7, and 8. Particularly, among the peripheral transistors having the plural circular contact plugs CP10 in the NAND flash memory 1, peripheral transistors 5 to 8 of FIG. 8 have the minimum diameter of contact plug CP10 and the minimum distance between the adjacent contact plugs CP10.

Hereinafter the circular contact plugs CP10 included in peripheral transistors 5, 6-2, 7, and 8 are referred to as first contact plugs CP10-1, and the elliptical contact plug CP10 included in peripheral transistor 6-1 is referred to as second contact plug CP10-2. It is assumed that dp_min is a minimum value of the planar diameter of the first contact plug CP10-1 and Sp_min is the distance between the adjacent first contact plugs CP10-1. It is assumed that Wmin is a minimum width in the gate width direction of the impurity diffusion layers 32 and 33 in peripheral transistors 5, 6-2, 7, and 8 having the first contact plugs CP10-1.

The elliptical contact plug CP10 included in peripheral transistor 6-1 is referred to as second contact plug CP10-2. It is assumed that dp_rect is a diameter in the major axis direction of the second contact plug CP10-2 and W1 is the width in the gate width direction of the impurity diffusion layers 32 and 33 of peripheral transistor 6-1. The width in the minor axis direction of the second contact plug CP10-2 is equal to the minimum value dp_min of the planar diameter of the first contact plug CP10-1.

The major axis dp_rect of the second contact plug CP10-2 is substantially equal to the sum of the twofold minimum value dp_min and the distance Sp_min between the adjacent first contact plugs CP10-1. The width W1 of the source and/or drain of peripheral transistor 6-1 is less than the sum of the triple minimum value dp_min and the twofold distance Sp_min, and is greater than the major axis dp_rect. The width W1 is less than the minimum width Wmin, and the minimum width Wmin is greater than the sum of the triple minimum value dp_min and the twofold distance Sp_min. The width W1 is greater than the widths of the source and drain in the gate width direction of the memory cell transistor MT.

The first contact plug CP10-1 and second contact plug CP10-2 of FIG. 8 are formed by a photolithographic technique. After the interlayer insulating film 35 is deposited, a photoresist is applied onto the interlayer insulating film 35, and a pattern for forming the first contact plug CP10-1 and second contact plug CP10-2 is formed in the photoresist by the photolithographic technique. Then contact holes for forming the first contact plug CP10-1 and second contact plug CP10-2 are made in the interlayer insulating film 35 by anisotropic etching such as reactive ion etching (RIE) so as to reach the source and drain 32 and 33. Then the contact holes are buried by a conductive film (e.g. metal) to complete the first contact plug CP10-1 and second contact plug CP10-2.

In the production process, design dimensions of the first contact plug CP10-1 and second contact plug CP10-2 in the mask used in the photolithography and dimensions of the contact holes actually made in the interlayer insulating film 35 will be described below. FIG. 9 illustrates a shape of the mask to make a contact hole for the first contact plug CP10-1 and a planar photograph of the actually-made contact holes. As illustrated in FIG. 9, the mask pattern used to form the first contact plug CP10-1 has a square shape. The minimum dimensions on the mask of the contact holes that can, in currently design rule, be made are A1 (for example, 90 nm)

long and A1 wide, and the distance between adjacent holes is B1 (for example, 180 nm). The contact hole becomes the circular planar shape when the contact hole is made using the mask pattern. The diameter of the contact hole is a1=a2=approximately 70 nm (that is, dp_min=70 nm), and the distance between adjacent holes is b1=approximately 200 nm (that is, Sp_min=approximately 200 nm).

FIG. 10 illustrates a shape of the mask to make a contact hole for the second contact hole CP10-2 and a planar photograph of the actually-made contact holes. As illustrated in FIG. 10, the mask pattern used to form the second contact hole CP10-2 has a rectangular shape. The dimensions on the mask are C1 (for example, 360 nm) long and A1 (for example, 90 nm) width that is identical to the diameter of the first contact plug CP10-1. The contact hole becomes the elliptical planar shape when the contact hole is made using the mask pattern. The contact hole has the major axis c1 (approximately 290 nm) and the minor axis a3 (approximately 60 nm).

The diameter of the first contact plug CP10-1 is greater than the minor axis of the second contact plug CP10-2.

(Effect)

As described above, in the semiconductor device of the embodiment, the contact resistance can be reduced to improve the operational reliability. The effect will be described below.

As described in the background, recently design rules have become finer in the NAND flash memory. Particularly the microfabrication of the cell size has achieved remarkable development. The transistor size in the peripheral circuit is also shrunk with the development of the microfabrication of the cell size.

Therefore, there is a problem in that a contact resistance of the peripheral transistor is increased with the development of the microfabrication. This is mainly attributed to the following two facts.

(1) With the development of the microfabrication, surface areas of the source and drain of the peripheral transistor is reduced, and the sufficient number of contact plugs cannot be disposed on the source and drain. In the peripheral transistor, preferably at least three contact plugs are formed in each of the source and drain. However, the three contact plugs are hardly formed because of the development of the microfabrication. That is, a contact area between the contact plug and the source and drain is not sufficiently secured, thereby increasing the contact resistance.

(2) A temperature of the production process falls due to the development of the microfabrication. Therefore, heat treatment for activating the impurities in the source and drain becomes insufficient to reduce the contact resistance.

When the contact resistance is increased, an amount of current (on-current) that the peripheral transistor can drive is reduced, thereby degrading the operational reliability of the NAND flash memory. Particularly the increase in contact resistance becomes a large problem in the p-channel MOS transistor in which the factor (2) is remarkable. The increase in contact resistance is remarkable when the source/drain diffusion layer of the p-channel MOS transistor is formed using boron having a light atomic mass.

However, in the semiconductor device of the first embodiment, contact plug CP10-2 having the elliptical planar shape is formed in the p-channel MOS transistor 6-1 in which the microfabrication develops too close to dispose at least three contact plugs CP10-1.

When compared to the circular contact plug CP10-1, the contact area can be increased between the contact plug and the source and drain. As a result, the current passed through MOS transistor 6-1 can be increased to improve the operational reliability of the NAND flash memory.

The plane area where the three first contact plugs CP10-1 are formed and the plane area where the one second contact plug CP10-2 is formed are compared from the actual dimensions of FIG. 10.

The plane area per one first contact plug CP10-1 is approximately 3846 nm$^2$. The plane area of the three first contact plugs CP10-1 becomes approximately 11540 nm$^2$. On the other hand, the plane area per one second contact plug CP10-2 becomes approximately 16626 nm$^2$. Assuming that the first contact plug CP10-1 is equal to the second contact plug CP10-2 in height, the plane area where the one second contact plug CP10-2 is formed is greater than the plane area where the three first contact plugs CP10-1 are formed.

When the first and second contact plugs CP10-1 and CP10-2 are equal to each other in height (depth), it is considered that the resistance becomes less in the one second contact plug CP10-2 than in the three first contact plugs CP10-1.

This is attributed to the fact that the region corresponding to the distance Sp_min can be used as a conductive portion in the second contact plug CP10-2. When a positive resist is used, a rate of the distance Sp_min is controlled by exposure rather than by making the contact hole, and it is necessary that the distance Sp_min become approximately twice the minimum value dp_min. In the finished shape, even if the diameter in the minor axis direction of the second contact plug CP10-2 becomes less than the diameter of the first contact plug CP10-1, the second contact plug CP10-2 is less than the first contact plug CP10-1 in resistance.

When the three first contact plugs CP10-1 are formed in the gate width direction of the MOS transistor, it is necessary that the width Wmin in dimensions on the mask be (Sp_min×2+dp_min×3)=630 nm+α (alignment margin). On the other hand, when the one second contact plug CP10-2 is formed in the gate width direction of the MOS transistor, it is necessary that the width W1 in dimensions on the mask be only the diameter dp_rect=360 nm+α (alignment margin). That is, the width W1 in the channel width direction of the second MOS transistor having the one elliptical second contact plug CP10-2 is less than the width Wmin in the channel width direction of the first MOS transistor having the three circular first contact plugs CP10-1. The three first contact plugs CP10-1 are greater than the one second contact plug CP10-2 in contact resistance. That is, the width W1 on the mask can be formed to be less than the width Wmin.

FIG. 11A illustrates examples of the resistances of the actual first contact plug CP10-1 and second contact plug CP10-2. FIG. 11A is a table illustrating specifications necessary for the n- and p-channel MOS transistors, the contact resistance of the two circular-hole contact plugs (first contact plugs CP10-1), and the contact resistance of the one elliptical-hole contact plug (second contact plug CP10-2).

As illustrated in FIG. 11A, the specifications of the n- and p-channel MOS transistors requires contact resistances of 1 to 2 kΩ or less and 3 to 5 kΩ or less, respectively. When the two first contact plugs CP10-1 are used in the p-channel MOS transistor, the contact resistance becomes 10 to 100 kΩ, and thus the specifications are not satisfied. However, in the first embodiment, because the second contact plug CP10-2 is used, the contact resistance becomes 1 to 3 kΩ) to largely reduce the contact resistance.

The low-temperature production process has little influence on the n-channel MOS transistor. Accordingly, the n-channel MOS transistor may satisfy the specifications of the contact resistance even if the two second contact plugs CP10-1 are used.

In the first embodiment, the microfabrication can develop of the gate width of the n-channel MOS transistor while the contact resistance of the p-channel MOS transistor is decreased.

Figure 11B:
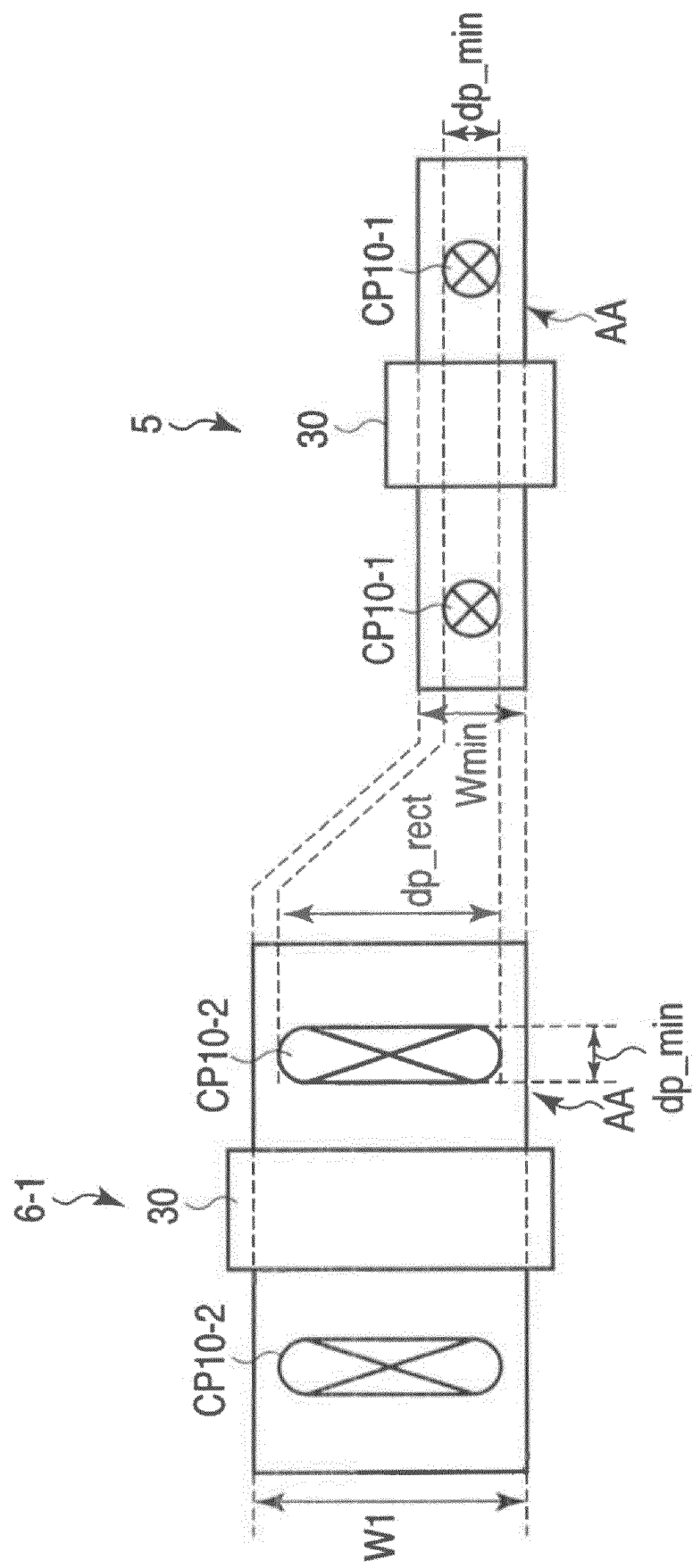
FIG. 11B is a plan view illustrating the peripheral transistor of a modification of the first embodiment.

Sometimes the gate width of the MOS transistor is decreased by developing the microfabrication of the peripheral circuit. Further, as illustrated in FIG. 11B, the n-channel MOS transistor is less than the p-channel MOS transistor in contact resistance. That is, sometimes the n-channel MOS transistor satisfies the specifications of the contact resistance when one first contact plug is disposed in the source or drain.

At this point, the width Wmin of the n-channel MOS transistor in which the one first contact plug is used becomes less than the width W1 of the p-channel MOS transistor in which the one second contact plug is used. That is, the microfabrication can develop in the gate width direction of the n-channel MOS transistor while the contact resistance of the p-channel MOS transistor is decreased.

Second Embodiment

A semiconductor device according to a second embodiment of the invention will be described below. In the second embodiment, peripheral transistor 6-1 of the first embodiment is used in the sense amplifier of the NAND flash memory 1. Because other configurations are similar to those of the first embodiment, the description is omitted.

(Circuit Configuration of Sense Amplifier)

Figure 12:
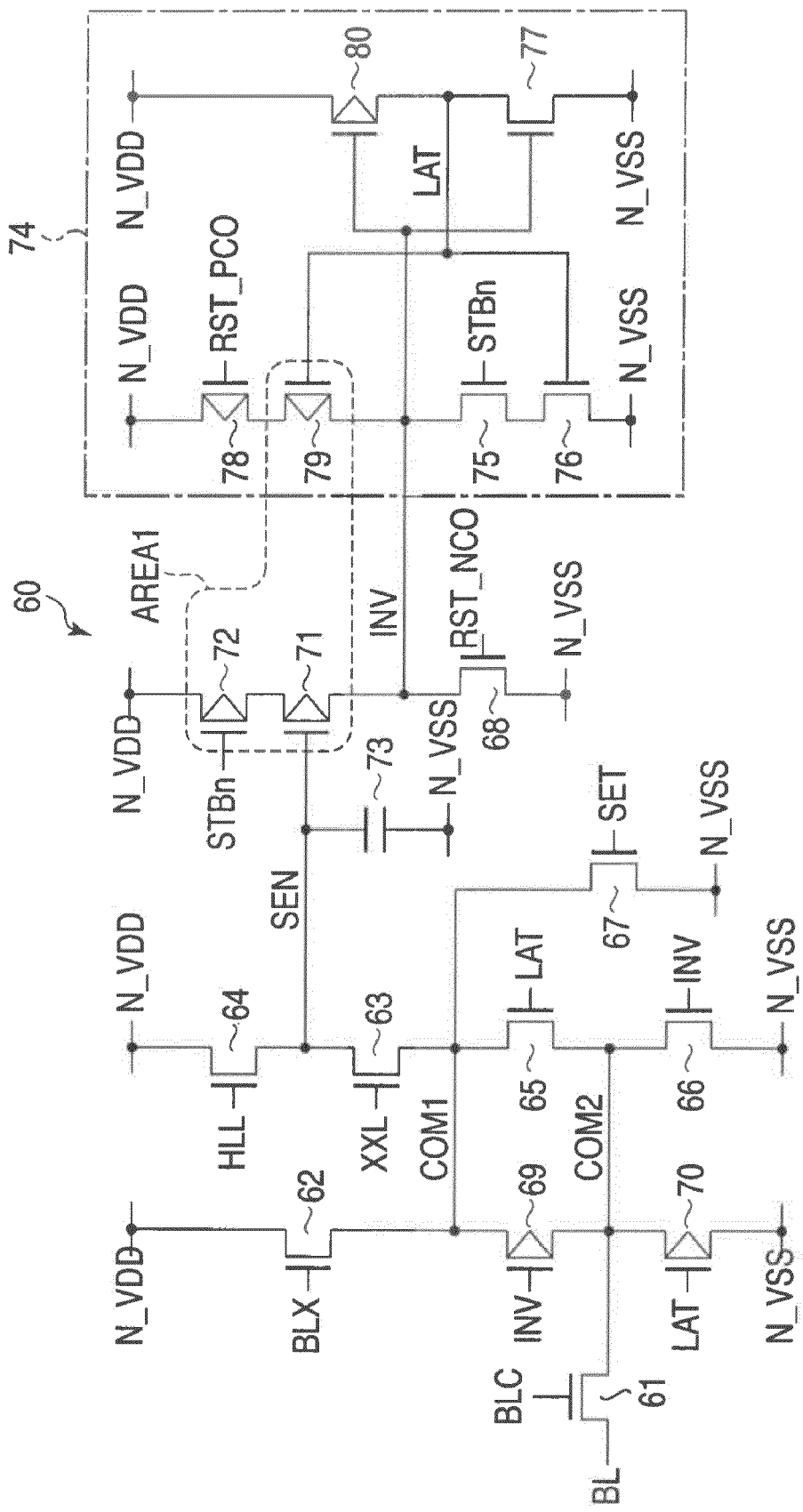
FIG. 12 is a circuit diagram illustrating a sense amplifier according to a second embodiment of the invention.

A circuit configuration of the sense amplifier will be described with reference to FIG. 12. FIG. 12 is a circuit diagram illustrating a sense amplifier of the second embodiment.

As illustrated in FIG. 12, a sense amplifier 60 includes n-channel MOS transistors 61 to 68, p-channel MOS transistors 69 to 72, a capacitance element 73, and a latch circuit 74.

In MOS transistor 61, one end of the current path is connected to one of the bit lines BL, the other end is connected to a node COM2, and a signal BLC is applied to the gate. In MOS transistor 70, one end of the current path is connected to node COM2, the other end is connected to a node N_VSS to which a voltage VSS (for example, zero) is applied, and the gate is connected to a node LAT. In MOS transistor 66, one end of the current path is connected to node COM2, the other end is connected to node N_VSS, and the gate is connected to a node INV. In MOS transistor 69, one end of the current path is connected to node COM2, the other end is connected to a node COM1, and the gate is connected to node INV. In MOS transistor 65, one end of the current path is connected to node COM2, the other end is connected to node COM1, and the gate is connected to node LAT. In MOS transistor 67, one end of the current path is connected to node COM1, the other end is connected to node N_VSS, and a signal SET is fed into the gate. In MOS transistor 62, one end of the current path is connected to a node N_VDD to which a voltage VDD (for example, 1.5 V) is applied, the other end is connected to node COM1, and a signal BLX is fed into the gate. In MOS transistor 63, one end of the current path is connected to a node SEN, the other end is connected to node COM1, and a signal XXL is fed into the gate. In MOS transistor 64, one end of the current path is connected to node N_VDD, the other end is connected to node SEN, and a signal HLL is fed into the gate. In the capacitance element 73, one of electrodes is connected to node SEN, and the other electrode is connected to node N_VSS. In MOS transistor 68, one end of the current path is connected to node INV, the other end is connected to node N_VSS, and a signal RST_NCO is fed into the gate. In MOS transistor 71, one end of the current path is connected to node INV, and the gate is connected to node SEN. In MOS transistor 72, one end of the current path is connected to node N_VDD, the other end is connected to one end of the current path of MOS transistor 71, and a signal STBn is fed into the gate.

The latch circuit 74 latches the data at node INV that is a connection node of MOS transistors 68 and 71. That is, the latch circuit 74 includes n-channel MOS transistors 75 to 77 and p-channel MOS transistors 78 to 80.

In MOS transistor 75, one end of the current path is connected to node INV, and signal STBn is fed into the gate. In MOS transistor 76, one end of the current path is connected to node N_VSS, the other end is connected to one end of the current path of MOS transistor 75, and the gate is connected to node LAT. In MOS transistor 79, one end of the current path is connected to node INV, and the gate is connected to node LAT. In MOS transistor 78, one end of the current path is connected to node N_VDD, the other end is connected to one end of the current path of MOS transistor 79, and a signal RST_PCO is fed into the gate. In MOS transistor 77, one end of the current path is connected to node N_VSS, the other end is connected to node LAT, and the gate is connected to node INV. In MOS transistor 80, one end of the current path is connected to node N_VDD, the other end is connected to node LAT, and the gate is connected to node INV.

(Planar and Cross-Sectional Configurations of Sense Amplifier)

Figure 13:
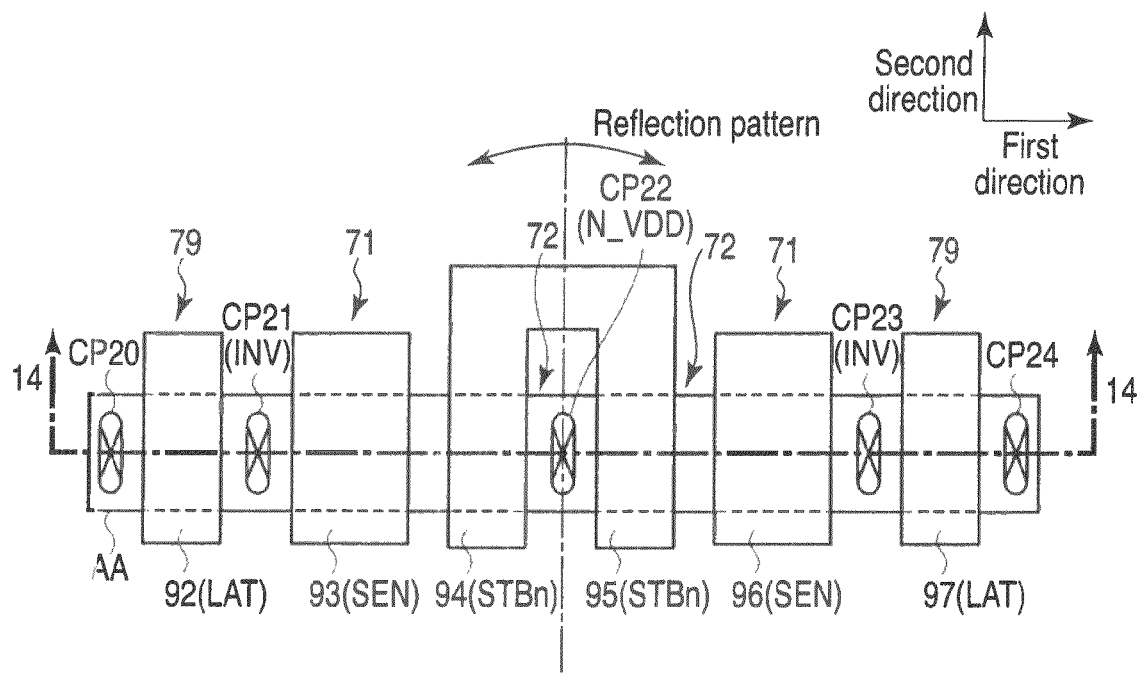
FIG. 13 is a plan view illustrating the sense amplifier of the second embodiment.
Figure 14:
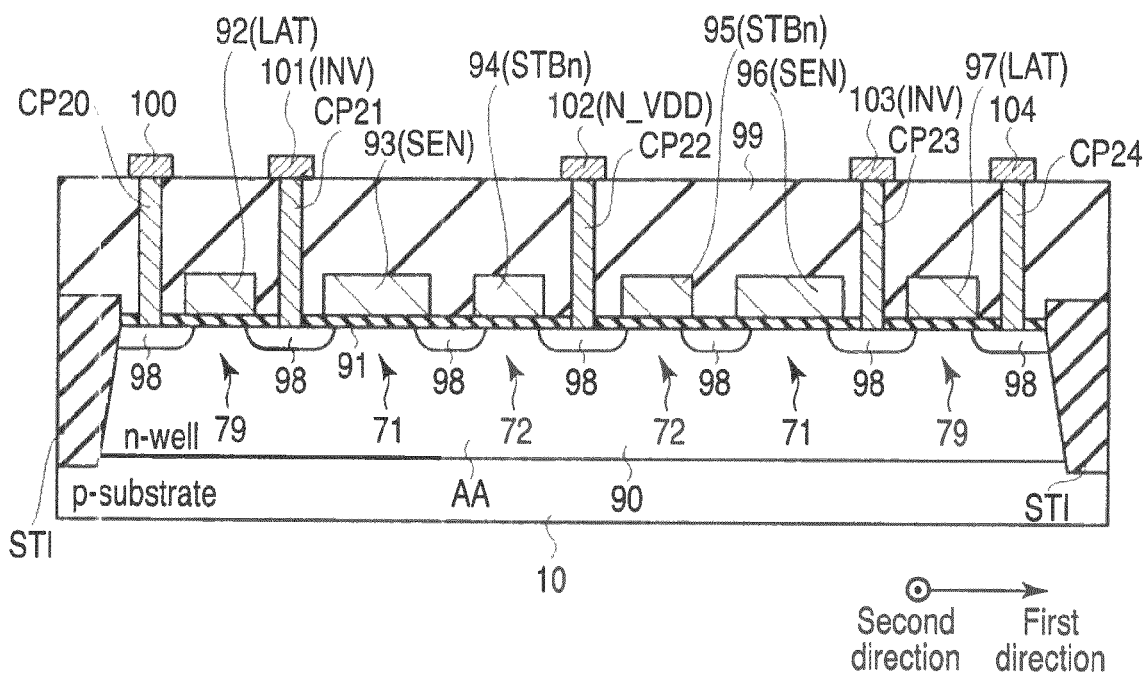
FIG. 14 is a cross-sectional view taken along line 14-14 of FIG. 13.

Planar and cross-sectional configurations in a partial region of the sense amplifier will be described with reference to FIGS. 13 and 14. FIG. 13 is a plan view illustrating the region AREA1 of FIG. 12, and FIG. 14 is a sectional view taken along line 14-14 of FIG. 13. The first direction and second direction in FIGS. 13 and 14 are not always matched with the first direction and second direction in FIGS. 2 and 3.

As illustrated in FIGS. 13 and 14, the stripe-like element region AA is provided in the first direction in the semiconductor substrate 10. An n-type well region 90 is formed in the surface region of the element region AA, and stripe-like gate electrodes 92 to 97 are formed on the n-type well region 90 in the second direction orthogonal to the first direction while a gate insulating film 91 is interposed therebetween. In the second direction, each of the gate electrodes 92 to 97 is formed so as to cross the element region AA.

The gate electrodes 94 and 95 act as the gate electrode of MOS transistor 72. The gate electrodes 94 and 95 are commonly connected on the isolation region STI, and signal STBn is applied to the gate electrodes 94 and 95. That is, the gate electrodes 94 and 95 are formed into a U-shape as a whole, and cross the element region AA at two points. The gate electrodes 93 and 96 act as the gate electrode of MOS transistor 71 and are connected to node SEN. The gate electrodes 92 and 97 act as the gate electrode of MOS transistor 79 and are connected to node LAT. A $p^+$-type impurity diffusion layer 98 is formed in the surface region of the well region 90 between the gate electrodes. The impurity diffusion layers 98 act as the source or drain of MOS transistors 71, 72, and 79.

An interlayer insulating film 99 is formed on the semiconductor substrate 10 such that MOS transistors 71, 72, and 79 are covered therewith. Contact plugs CP20 to CP24 are formed in the interlayer insulating film 99. Metal interconnection layers 100 to 104 are formed on the interlayer insulating film 99, and connected to contact plugs CP20 to CP24, respectively.

Contact plug CP21 is connected to the impurity diffusion layer 98 between the gate electrodes 92 and 93, and connected to node INV through the metal interconnection layer 101. Contact plug CP22 is connected to the impurity diffusion layer 98 between the gate electrodes 94 and 95, and connected to node N_VDD through the metal interconnection layer 102. Contact plug CP23 is connected to the impurity diffusion layer 98 between the gate electrodes 96 and 97, and connected to node INV through the metal interconnection layer 103. Contact plug CP20 is connected to the impurity diffusion layer 98, which is located across the gate electrode 92 from the impurity diffusion layer 98 connected to contact plug CP21. Contact plug CP20 is further connected to MOS transistor 78 through the metal interconnection layer 101. Contact plug CP24 is connected to the impurity diffusion layer 98, which is located across the gate electrode 97 from the impurity diffusion layer 98 connected to contact plug CP23. Contact plug CP24 is further connected to MOS transistor 78 through the metal interconnection layer 104.

Thus, on the element region AA, MOS transistors 71, 72, and 79 are symmetrically formed in relation to an axis located between the gate electrodes 94 and 95. In other words, MOS transistors 71, 72, and 79 are formed as a reflection pattern centered in the axis. Peripheral transistor 6-1 of the first embodiment is used as MOS transistors 71, 72, and 79. That is, contact plugs CP20 to CP24 are formed into the elliptical planar shape having the major axis dp_rect.

(Operation of Sense Amplifier)

Operation of the above sense amplifier will briefly be described with reference to FIG. 12. Hereinafter, that the memory cell transistor MT is turned on in reading the data is referred to as binary-1 read ("1" read), and that the memory cell transistor MT is turned off in reading the data is referred to as binary-0 read ("0" read). During the read operation, signals BLX and XXL are set to Vt+0.9 V and Vt+1.2 V, respectively. Signal BLC is set to VTN+0.7 V. MOS transistors 62 and 63 have a threshold voltage Vt and MOS transistor 61 has a threshold voltage VTN.

During a reset operation, signals SET and RST_NCO can be made high, whereby nodes COM1 and INV are made low (0 V) while node LAT is made high (VDD). On the other hand, during normal operation, signals SET and RST_NCO are made low, and MOS transistors 67 and 68 are turned off. Signal RST_PCO can be made high during a reset operation, and is low during normal operation.

(Case I)

Case I in which the "1" read is performed will be described below.

First the bit line BL is pre-charged. In the following description, it is assumed that pre-charge level VPRE is set to 0.7 V.

MOS transistor 62 performs the pre-charge. That is, MOS transistor 62 is turned on by applying signal BLX. Because the memory cell unit 4 is in the conduction state, the current is passed through the bit line BL via the current paths of MOS transistors 65, 61, and 69 and nodes COM1 and COM2. As a result, the potential at the bit line BL becomes approximately 0.7 V. That is, the potential at the bit line BL is fixed to approximately 0.7 V while the current is passed from the bit line BL to the source line SL. At this point, MOS transistors 66 and 70 are turned off. The capacitance element 73 is charged by applying signal HLL, and therefore the potential at node SEN becomes approximately 2.5 V.

Then node SEN is discharged. Signal HLL is made low to turn off MOS transistor 64. Therefore, node SEN is discharged by the current passed from node SEN to the bit line BL, and the potential at node SEN is reduced to approximately 0.9 V (low).

Subsequently, node SEN is discharged. At this point, MOS transistor 62 starts to supply the current when the potential at node COM1 is reduced to 0.9 V or less. Therefore, the potential at node COM1 is maintained at 0.9 V.

Then the data is sensed. Signal STBn is made low to turn on MOS transistor 72. Because the potential at node SEN is 0.9 V, MOS transistor 71 is turned on. Therefore, node INV goes high (VDD), and the latch circuit 74 latches high level (VDD). When node INV goes high, MOS transistor 77 is turned on to make node LAT low, whereby MOS transistors 65 and 69 are turned off while MOS transistors 66 and 70 are turned on. Therefore, the bit line BL is connected to node N_VSS through the current paths of MOS transistors 66 and 70, and the potential at the bit line BL is fixed to VSS.

(Case II)

Case II in which the "0" read is performed will be described below.

In Case II, the current is not passed through the bit line BL, and the potential at bit line BL is kept at 0.7 V. The potential at node SEN is kept at approximately 2.5 V (high). Accordingly, MOS transistor 71 is turned off to keep node INV low. The latch circuit 74 latches the low level at node INV.

The sense amplifier of the second embodiment senses the current passed through the bit line BL to perform the read operation. In the second embodiment, the process from the pre-charge to the sensing is performed once or plural times (for example, two times) in reading the data. When the sensing is performed twice, in the first-time read, the read is performed to the memory cell transistor MT through which the cell current is easy to pass, and then the read is performed to the memory cell transistor MT through which the cell current is difficult to pass. That is, the second-time read operation is not performed to the bit line BL in which the first-time read operation corresponds to Case I, and the potential at the bit line BL is fixed. On the other hand, the second-time read operation is performed to the bit line BL in which the first-time read operation corresponds to Case II. This is because an influence of a noise (potential fluctuation) of the source line SL is suppressed. In the second-time read operation, the read is performed while the memory cell transistor MT that is turned on in the first-time read operation is turned off.

(Effect)

As described above, peripheral transistor 6-1 of the first embodiment can be used as the p-channel MOS transistor comprised in the sense amplifier. Particularly, for the current sensing type sense amplifier, it is important that the MOS transistor of the sense amplifier sufficiently drive the current from the viewpoint of the operational reliability. Accordingly, desirably peripheral transistor 6-1 is used as the p-channel MOS transistor of the sense amplifier.

Particularly, it is important that the contact resistances of the p-channel MOS transistors 71 and 72 be reduced for the potential at node INV, which determines the latch data. When the contact resistances of the p-channel MOS transistors 71 and 72 are increased, the potential at node INV is reduced, and node INV goes low although node SEN is low, which causes a false read.

In FIG. 13, the contact plugs having the elliptical planar shapes are used in MOS transistors 71, 72, and 79. Alternatively, obviously the contact plugs having the elliptical planar shapes may be used also in MOS transistors 69, 70, 78, and 80.

In the semiconductor devices of the first and second embodiments, the contact plug that comes into contact with the p-channel MOS transistor is formed into the elliptical planar shape, so that the contact resistance of the p-channel MOS transistor can be reduced to improve the operational reliability of the semiconductor device. Particularly the configurations of the first and second embodiments are effectively applied to the semiconductor device such as the semiconductor storage device, in which the development of the microfabrication is achieved.

For example, in the semiconductor device, desirably the elliptical contact plug is used in the MOS transistor which needs the contact area substantially equal to the sum of the two first contact plugs (circular planar shape) and the area between the adjacent first contact plugs, in the MOS transistor with a plural first contact plugs. Desirably the elliptical contact plug is used in the MOS transistor in which the development of the microfabrication is achieved such that the width of the source or drain in the gate width direction is less than the sum of the triple plane size of the first contact plug and the twofold distance between the adjacent first contact plugs. That is, according to the design rule, desirably the elliptical contact plug is used in the MOS transistor having the gate width in which the two first contact plugs can be disposed in the source or drain in the gate width direction.

Contact plugs CP20 to CP24 of FIG. 13 can be formed without changing a layout on the conventional design. This point will be described with reference to FIG. 15. FIG. 15 is a layout of the sense amplifier in the design stage, and illustrates the case in which each of contact plugs CP20 to CP24 are designed by the two first contact plugs CP10-1. Hereinafter the first contact plugs CP10-1 corresponding to contact plugs CP20 to CP24 are referred to as contact plugs CP20' to CP24', respectively.

The mask data produced from the design layout of FIG. 15 is converted in order to form the first contact plugs CP20 to CP24. That is, the sizes of contact plugs CP20' to CP24' are changed in the region where the element region AA and the source/drain impurity implanting region XP overlap each other. Specifically the sizes of contact plugs CP20' to CP24' are enlarged by Sp_min/2. Therefore, each two of contact plugs CP20' to CP24', which are adjacent in the second direction, come into contact with each other. At this point, contact plugs CP20' to CP24' are also enlarged in the first direction by Sp_min/2, and contact plugs CP20' to CP24' are also enlarged by Sp_min/2 in the second direction opposite the direction in which each two of contact plugs CP20' to CP24' are adjacent. Accordingly, each two of contact plugs CP20' to CP24', which are adjacent in the second direction, are reduced by Sp_min/2, which allows the mask data of the second contact plugs CP20 to CP24 to be produced by each two of contact plugs CP20' to CP24'.

The distance Sp_min2 between contact plugs CP23' and CP24' adjacent in the first direction and the distance Sp_min2 between contact plugs CP20' and CP21' adjacent in the first direction become greater than the distance Sp_min, because contact plugs CP23' and CP24' and contact plugs CP20' and CP21' are disposed with the gate electrodes 79 and 71 interposed therebetween, respectively. That is, in the conversion, the contact plugs adjacent in the first direction are not connected to each other.

Only the first contact plug 10-1 of the necessary kind of the MOS transistor of the necessary circuit can be converted into the second contact plug CP10-2 by the mask data conversion. In the second embodiment, the first contact plugs CP20', CP21', CP23', and CP24' connected to the source and drain of MOS transistors 71 and 79 of the sense amplifier and the first contact plug CP22' connected to the source or drain of MOS transistor 72 are converted into the second contact plugs.

When the first contact plug 10-1 of the n-channel MOS transistor is converted into the second contact plug CP10-2, the size of the first contact plug CP10-1 may be changed in the region where the element region AA and the implanting region for forming the source/drain of the n-channel MOS transistor overlap each other.

Only one kind of the first contact plug may be used in the layout, which facilitates the layout production and layout verification. A rectangular contact may be produced by combining at least three first contact plugs CP10-1.

However, the above-described sizes are cited only by way of example, and the configuration of the second embodiment can be applied to the p-channel MOS transistor in which the low resistance is demanded irrespective of the size. The configuration of the second embodiment may be applied not only to the p-channel MOS transistor but also to the n-channel MOS transistor.

It is not always necessary that the planar shape of the second contact plug CP10-2 is the completely elliptical shape, but the second contact plug CP10-2 may be formed into a rectangular shape in which the lengthwise size differs from the lateral size. However, as described above, the corner portion of the rectangular second contact plug CP10-2 usually becomes the arc shape when the second contact plug CP10-2 is formed using the mask. That is, it is also said that the planar shape of the second contact plug CP10-2 becomes the rectangular shape whose corner portion is rounded.

In the first and second embodiments, the sense amplifier has been cited as an example of the peripheral transistor in which the second contact plug CP10-2 is formed. Alternatively, the second contact plug CP10-2 may be used in the row decoder or column decoder other than the sense amplifier.

In FIG. 6, the surface channel is formed in peripheral transistor 6-1 in which the second contact plug CP10-2 is formed. Alternatively, a buried channel may be formed in peripheral transistor 6-1. The case in which buried channel may be formed will be described with reference to FIG. 16. FIG. 16 is a sectional view illustrating peripheral transistors 6-1 along the gate length direction. As illustrated in FIG. 16, a thin p-type impurity diffusion layer 50 is formed in the well region 31 between the source and drain in the structure of FIG. 6. The impurity diffusion layer 50 is in contact with the gate insulating film 34. The thin p-type impurity diffusion layer 50 is depleted while zero voltage is applied to the gate electrode 30 and the impurity diffusion layers 32 and 33. The channel is formed near a boundary between the thin p-type impurity diffusion layer 50 and the n-type well region 31.

Figure 17:
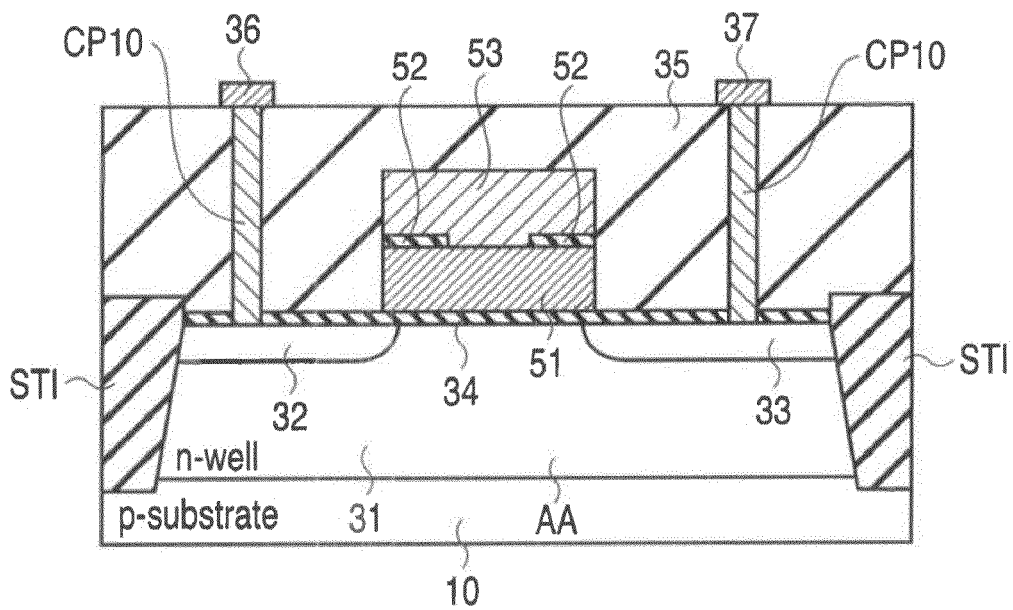

As with select transistors ST1 and ST2, the gate electrodes 30 of peripheral transistors 5 to 8 may have the stacked gate structure. FIG. 17 is a sectional view along the gate length direction of peripheral transistor 6 when the gate electrodes 30 of peripheral transistors 5 to 8 have the stacked gate structure. As illustrated in FIG. 17, the gate electrode includes a conductive layer 51 that is formed on the gate insulating film 34 and a conductive layer 53 that is formed on the conductive layer 51 with an inter-gate insulating film 52 interposed therebetween. The conductive layers 51 and 53 are electrically connected by removing part or the whole of the inter-gate insulating film 52. For example, the conductive layers 51 and 53 and the inter-gate insulating film 52 can be made of the same material as the polysilicon layers 14 and 16 and inter-gate insulating film 15 in the memory cell array 2.

Figure 18:
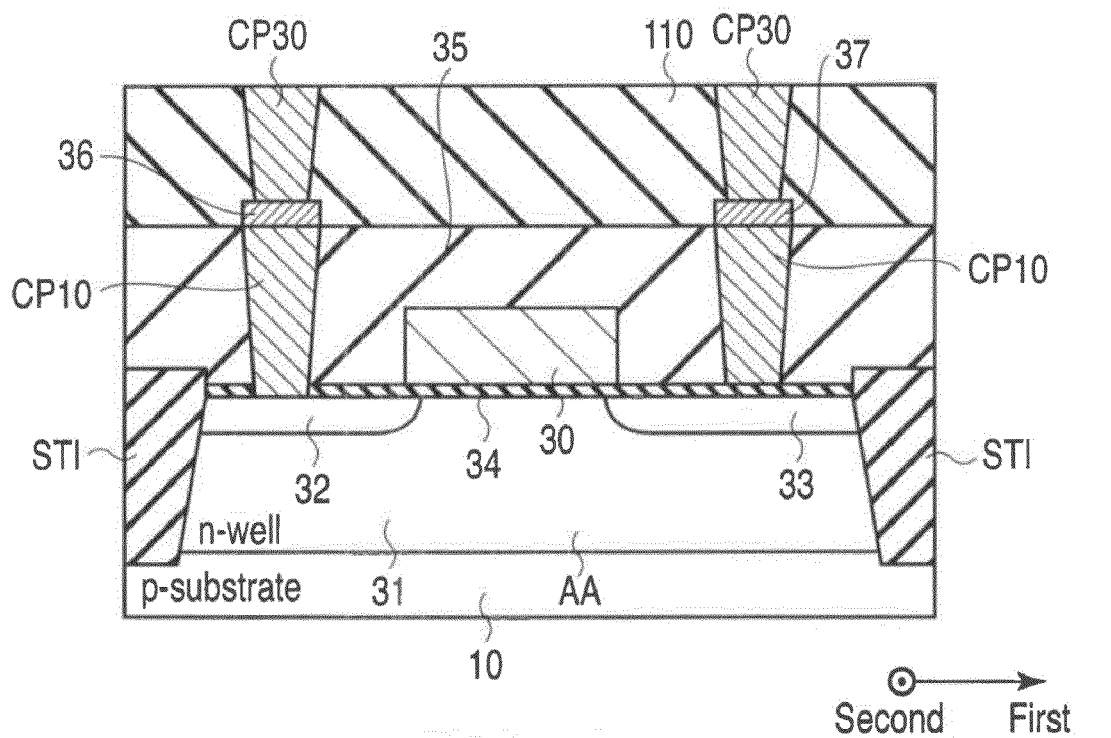
Figure 19:
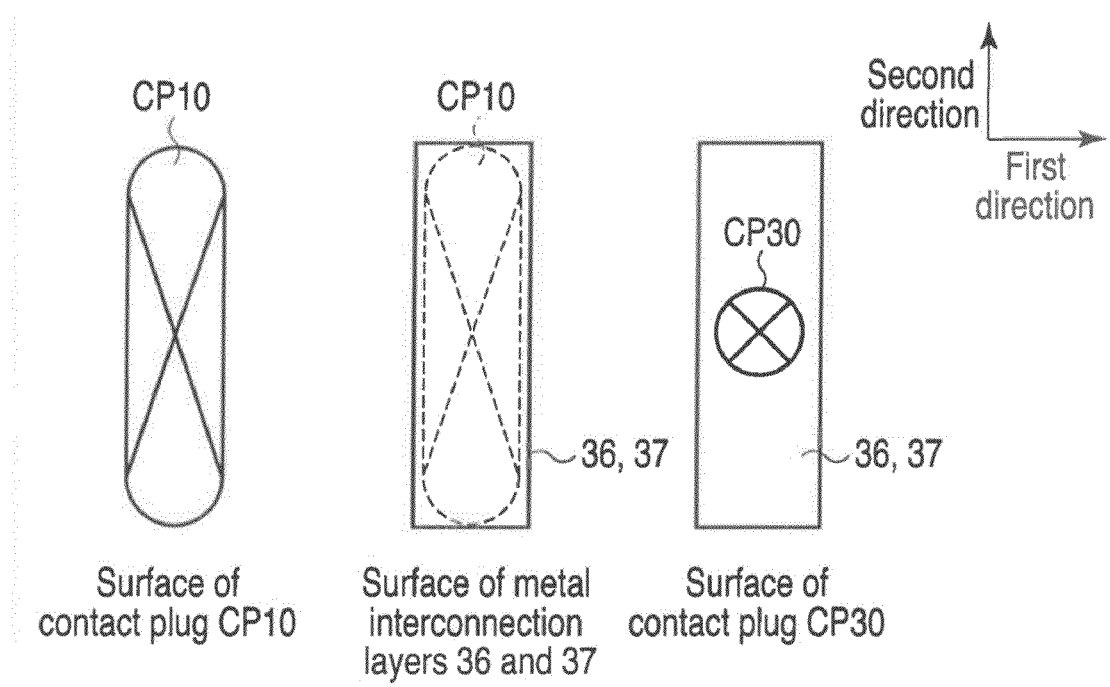
FIG. 19 is a plan view illustrating a peripheral transistor according to a modification of the first and second embodiments.

In the first and second embodiments, the processing margin can sufficiently be secured when fringeless contact structure is used. The fringeless contact will be described below. FIG. 18 is a sectional view of the MOS transistor, and illustrates the case in which the fringeless contact is used in peripheral transistor 6-1 of FIG. 6. As illustrated in FIG. 18, contact plugs CP30 are further formed on the metal interconnection layers 36 and 37. FIG. 19 is a plan view illustrating a surface of contact plug CP10, surfaces of the metal interconnection layers 36 and 37, and a surface of contact plug CP30.

As illustrated in FIG. 19, for the fringeless contact, in the metal interconnection layers 36 and 37 that connect contact plugs CP10 and contact plugs CP30, the lateral size (first direction in FIGS. 18 and 19) is equalized to the minor axis (dp_min) of contact plug CP10, and the lengthwise size (second direction orthogonal to the first direction in FIGS. 18 and 19) is equalized to the major axis (dp_rect) of contact plug CP10. That is, as illustrated in FIG. 18, the metal interconnection layers 36 and 37 completely overlap contact plugs CP10, respectively.

Conventionally, when the fringeless contact is used, an alignment margin between the contact plug and the metal interconnection layer is substantially eliminated, and the processing becomes difficult as the diameter of the contact plug is less. That is, when misalignment occurs, the contact area between the contact plug and the metal interconnection layer is reduced to increase the contact resistance.

Figure 20:
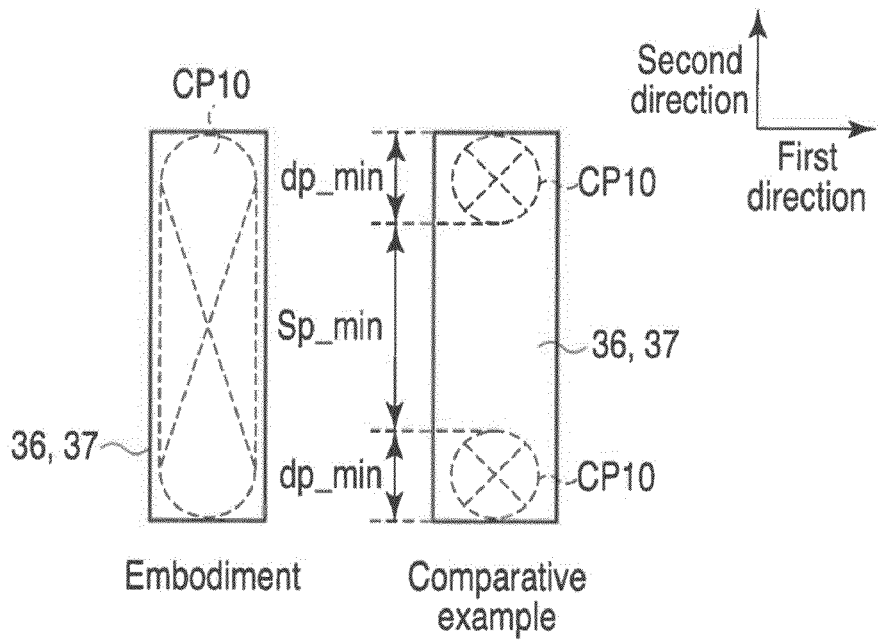
FIG. 20 is a plan view of the peripheral transistors.

However, contact plug CP10 of the first and second embodiments has the elliptical planar shape. Accordingly, even if misalignment occurs in the second direction, the contact area between contact plug CP10 and the metal interconnection layers 36 and 37 can sufficiently be secured. This point will be described below by taking the case in which the two circular contact plugs CP10 are disposed in the second direction as a comparative example. FIG. 20 is a plan view illustrating surfaces of the metal interconnection layers 36 and 37 in the configuration of FIG. 19 and the comparative example. In contact plug CP10 of the comparative example, the diameter is equal to the minor axis dp_min of contact plug CP10 of FIG. 19, and the distance between the adjacent contact plugs CP10 is Sp_min. For the comparative example, when misalignment occurs in the second direction by dp_min, the contact resistance becomes double compared with contact plug CP10 of FIG. 19. The alignment margin becomes less than dimension on the mask as illustrated in the actual dimensions of FIG. 9. That is, when contact plug CP10 of the first and second embodiments is used, the tolerance for misalignment in the second direction can largely be increased compared with the comparative example. The same holds true for the formation of contact plug CP30. Therefore, the increase in contact resistance can be suppressed.

In the first and second embodiments, the p-type silicon substrate is used as the semiconductor substrate 10. Alternatively, another single-crystal semiconductor substrate, such as a SiGe mixed crystal and a SiGeC mixed crystal, which contains silicon may be used instead of the p-type silicon substrate. The conductive layers 14 and 16 functioning as a part of the gate electrode can be made of the SiGe mixed crystal, the SiGeC mixed crystal, silicide or polycide such as TiSi, NiSi, CoSi, TaSi, WSi, and MoSi, or metal such as Ti, Al, Cu, TiN, and W, the conductive layers 14 and 16 may be made of polycrystal, or may have the stacked structure thereof.

In the first and second embodiments, the NAND flash memory is cited by way of example. However, for example, the configurations of the first and second embodiments can also be applied to a 3Tr-NAND flash memory in which the number of memory cell transistors is set to one in the NAND flash memory or a NOR flash memory. The configurations of the first and second embodiments can also be applied to a 2Tr flash memory in which the drain-side select transistor ST1 is removed in the 3Tr-NAND flash memory, and the configurations of the first and second embodiments can widely be applied to the general nonvolatile semiconductor memory including the stacked gate structure. The application of the first and second embodiments is not limited to the semiconductor memory.

The NAND memory cell in which the polysilicon layer 14 is used as the floating gate has been described in the first and second embodiments. Obviously the configurations of the first and second embodiments can be applied to a NAND flash memory having a so-called MONOS structure in which, for example, a silicon nitride film, a silicon oxynitride film, a HfSiO film, a HfAlO film, an AlOx film, a HfO film, a TiO film, a TaO film, or a stacked structure thereof is used in the charge accumulation layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first MOS transistor with a first conductivity formed on a semiconductor substrate;
    a plurality of second MOS transistors with a second conductivity formed on the semiconductor substrate;
    a plurality of first contact plugs with a circular planar shape; and
    a second contact plug with an elliptical planar shape formed on a source or a drain in one of the second MOS transistors, the first contact plugs being formed on sources or drains in the remaining second MOS transistors and the first MOS transistor.

2. The device according to claim 1, wherein the second contact plug is a single contact plug formed in each source or drain,
    three of the first contact plugs are formed in each source or drain, and
    in the gate width direction, the width of the source or drain of the one of the second MOS transistors in which the second contact plug is formed is less than the width of the source or drain of the first MOS transistor.

3. The device according to claim 1, wherein the second contact plug is a single contact plug formed in each source or drain,
    one of the first contact plugs is formed in each source or drain, and
    in the gate width direction, the width of the source or drain of the first MOS transistor is less than the width of the source or drain the second MOS transistor in which the second contact plug is formed.

4. The device according to claim 2, wherein the distance between the adjacent first contact plugs is greater than the planar diameter of the first contact plug.

5. The device according to claim 1, wherein the first conductivity is an N-type,
    the second conductivity is a P-type, and
    the source and the drain of the second MOS transistor include boron as an impurity.

6. The device according to claim 2, wherein a plane area of the one second contact plug is greater than the sum of plane areas of the three first contact plugs.

7. The device according to claim 1, further comprising:
    a plurality of memory cell transistors formed on the semiconductor substrate and configured to store data;
    a memory cell array in which the memory cell transistors are arrayed; and a peripheral circuit configured to control a program operation, a read operation, and an erase operation on the memory cell array, wherein the peripheral circuit includes the first MOS transistor and the second MOS transistors.

8. The device according to claim 1, further comprising:

a memory cell array including the first MOS transistor; and a peripheral circuit configured to control a program operation, a read operation, and an erase operation on the memory cell array, wherein the peripheral circuit includes the second MOS transistors.

9. The device according to claim 1, wherein one of the second MOS transistors in which the second contact plug is formed includes an impurity diffusion layer with the second conductivity between the source and the drain.

10. A semiconductor device comprising:

a first MOS transistor with a first conductivity formed on a semiconductor substrate;

a second MOS transistor with a second conductivity formed on the semiconductor substrate;

a third MOS transistor with the second conductivity formed on the semiconductor substrate;

a plurality of first contact plugs with a circular planar shape formed on sources or drains of the first and third MOS transistors; and a second contact plug with an elliptical planar shape formed on a source or a drain of the second MOS transistor.

11. The device according to claim 10, wherein three of the first contact plugs are formed in each source or drain of the first MOS transistor, and in the gate width direction, the width of the source or drain of the second MOS transistor is less than the width of the source or drain of the first MOS transistor.

12. The device according to claim 10, wherein one of the first contact plugs is formed in each source or drain of the first MOS transistor, and in the gate width direction, the width of the source or drain of the second MOS transistor is greater than the width of the source or drain of the first MOS transistor.

13. The device according to claim 11, wherein the distance between the adjacent first contact plugs is greater than the planar diameter of the first contact plug.

14. The device according to claim 10, wherein the first conductivity is an N-type, the second conductivity is a P-type, and the source and the drain of the second MOS transistor include boron as an impurity.

15. The device according to claim 11, wherein a plane area of the second contact plug is greater than the sum of plane areas of the three of the first contact plugs.

16. The device according to claim 12, wherein three of the first contact plugs are formed in each source or drain of the third MOS transistor, and in the gate width direction, the width of the source or drain of the second MOS transistor is less than the width of the source or drain of the third MOS transistor.

17. The device according to claim 10, further comprising:

a fourth MOS transistor with the first conductivity formed on the semiconductor substrate;

a fifth MOS transistor with the second conductivity formed on the semiconductor substrate; and a plurality of the first contact plugs with the circular planar shape formed on sources or drains of the fourth and fifth MOS transistors, wherein a gate insulating film of the fourth MOS transistor is greater than a gate insulating film of the first MOS transistor in film thickness, and a gate insulating film of the fifth MOS transistor is greater than gate insulating films of the second and third MOS transistors in film thickness.

18. The device according to claim 11, further comprising:

a plurality of memory cell transistors formed on the semiconductor substrate and configured to store data;

a memory cell array in which the memory cell transistors are arrayed; and a peripheral circuit configured to control a program operation, a read operation, and an erase operation on the memory cell array, wherein the peripheral circuit includes the first to third MOS transistors, and in the first MOS transistor, a plane area of each of contact plugs formed on the source or drain is minimum and the distance between the adjacent contact plugs is minimum among MOS transistors with the first conductivity included in the peripheral circuit.

19. The device according to claim 12, further comprising:

a plurality of memory cell transistors formed on the semiconductor substrate and configured to store data;

a memory cell array in which the memory cell transistors are arrayed; and a peripheral circuit configured to control a program operation, a read operation, and an erase operation on the memory cell array, wherein the peripheral circuit includes the first to third MOS transistors, and in the first MOS transistor, a plane area of each of contact plugs formed on the source or drain is minimum and the distance between the adjacent contact plugs is minimum among MOS transistors with the first conductivity included in the peripheral circuit.

* * * * *